(12) United States Patent
Simoyama

(10) Patent No.: US 10,580,923 B2
(45) Date of Patent: Mar. 3, 2020

(54) OPTICAL SEMICONDUCTOR DEVICE AND OPTICAL TRANSCEIVER

(71) Applicants: FUJITSU LIMITED, Kawasaki-shi, Kanagawa (JP); Photonics Electronics Technology Research Association, Bunkyo-ku, Tokyo (JP)

(72) Inventor: Takasi Simoyama, Tsukuba (JP)

(73) Assignees: FUJITSU LIMITED, Kawasaki (JP); PHOTONICS ELECTRONICS TECHNOLOGY RESEARCH ASSOCIATION, Tokyo (JP)

( * ) Notice: Subject to any disclaimer, the term of this patent is extended or adjusted under 35 U.S.C. 154(b) by 0 days.

(21) Appl. No.: 16/426,573

(22) Filed: May 30, 2019

(65) Prior Publication Data

US 2019/0378949 A1    Dec. 12, 2019

(30) Foreign Application Priority Data

Jun. 6, 2018    (JP) .................................. 2018-108966

(51) Int. Cl.
*H01L 31/075* (2012.01)
*H01L 31/105* (2006.01)
*H01L 31/107* (2006.01)

(52) U.S. Cl.
CPC .......... *H01L 31/075* (2013.01); *H01L 31/105* (2013.01); *H01L 31/107* (2013.01)

(58) Field of Classification Search
None
See application file for complete search history.

(56) References Cited

U.S. PATENT DOCUMENTS

| 7,397,101 B1 * | 7/2008 | Masini ................. H01L 31/028 257/184 |
| 10,134,938 B2 * | 11/2018 | Novack ............... H01L 31/1075 |

(Continued)

FOREIGN PATENT DOCUMENTS

JP    2017-147352    8/2017

OTHER PUBLICATIONS

Dai, Daoxin, et al. "Bilevel Mode Converter between a Silicon Nanowire Waveguide and a Larger Waveguide." Journal of Lightwave Technology, vol. 24, No. 6, 2006, pp. 2428-2433., doi:10.1109/jlt.2006.874554 (Year: 2006).*

(Continued)

*Primary Examiner* — J. E. Schoenholtz
(74) *Attorney, Agent, or Firm* — Staas & Halsey LLP

(57) ABSTRACT

A disclosed optical semiconductor device includes a first semiconductor layer having a first refractive index and a first optical absorption coefficient; and a second semiconductor layer formed on the first semiconductor layer, the second semiconductor layer having a second refractive index and a second optical absorption coefficient. The second refractive index is larger than the first refractive index, and the second optical absorption coefficient is larger than the first optical absorption coefficient. The first semiconductor layer includes a first region of p-type, a second region of n-type, a third region of p-type or n-type between the first region and the second region, a fourth region of i-type between the first region and the third region, and a fifth region of i-type between the second region and the third region. The second semiconductor layer is formed on the first region, the fourth region, and the third region.

7 Claims, 31 Drawing Sheets

(56) References Cited

U.S. PATENT DOCUMENTS

| | | | | |
|---|---|---|---|---|
| 2013/0322813 | A1* | 12/2013 | Grondin | B82Y 20/00 385/14 |
| 2016/0301191 | A1* | 10/2016 | Orcutt | H04B 10/5053 |
| 2017/0338367 | A1* | 11/2017 | Novack | H01L 31/1075 |

OTHER PUBLICATIONS

"Optical Network Installation Guide", TR-3552 prepared by Optellent Inc. for NetApp, 2007 downloaded from URL<https://www.netapp.com/us/media/tr-3552.pdf> on Aug. 27, 2019 (Year: 2007).*
Patent Abstracts of Japan English abstract for Japanese Patent Publication No. 2017-147352, published Aug. 24, 2017.

* cited by examiner

OPTICAL SEMICONDUCTOR DEVICE AND OPTICAL TRANSCEIVER

CROSS-REFERENCE TO RELATED APPLICATION

This application is based upon and claims priority to earlier filed Japanese Patent Application No. 2018-108966 filed Jun. 6, 2018, which is incorporated herein by reference in its entirety.

FIELD

The disclosures discussed herein relate to an optical semiconductor device and an optical transceiver.

BACKGROUND

As the demand for computer processing capacity increases, increased bandwidths are required for data transmission and reception. Data transmission via electrical signals is becoming limited, requiring the application of optical signals. In order to efficiently convert an optical signal into an electrical signal, it is effective to integrate optical components into a device that processes an electrical signal to reduce the loss. Recent research and development in the field of silicon photonics, which make up various optical components on silicon (Si) substrates, have been attracting attention.

Various optical semiconductor devices have been proposed for Si photonics; however, sufficient opto-electric conversion efficiency is yet to be obtained.

RELATED ART DOCUMENT

Patent Document

Patent Document 1: Japanese Laid-open Patent Publication No. 2017-147352

SUMMARY

According to one aspect of the invention, an optical semiconductor device includes
a first semiconductor layer having a first refractive index and a first optical absorption coefficient; and
a second semiconductor layer formed on the first semiconductor layer, the second semiconductor layer having a second refractive index and a second optical absorption coefficient,
wherein the second refractive index is larger than the first refractive index, and the second optical absorption coefficient is larger than the first optical absorption coefficient,
wherein the first semiconductor layer includes
a first region of p-type,
a second region of n-type,
a third region of p-type or n-type between the first region and the second region,
a fourth region of i-type between the first region and the third region, and
a fifth region of i-type between the second region and the third region, and
wherein the second semiconductor layer is formed on the first region, the fourth region, and the third region.

According to another aspect of the invention, an optical transceiver includes the aforementioned optical semiconductor device.

The object and advantages of the invention will be realized and attained by means of the elements and combinations particularly pointed out in the appended claims.

It is to be understood that both the foregoing general description and the following detailed description are exemplary and explanatory and are not restrictive of the invention.

Additional objects and advantages of the embodiments will be set forth in part in the description which follows, and in part will be obvious from the description, or may be learned by practice of the invention.

DESCRIPTION OF EMBODIMENTS

Figure 1:
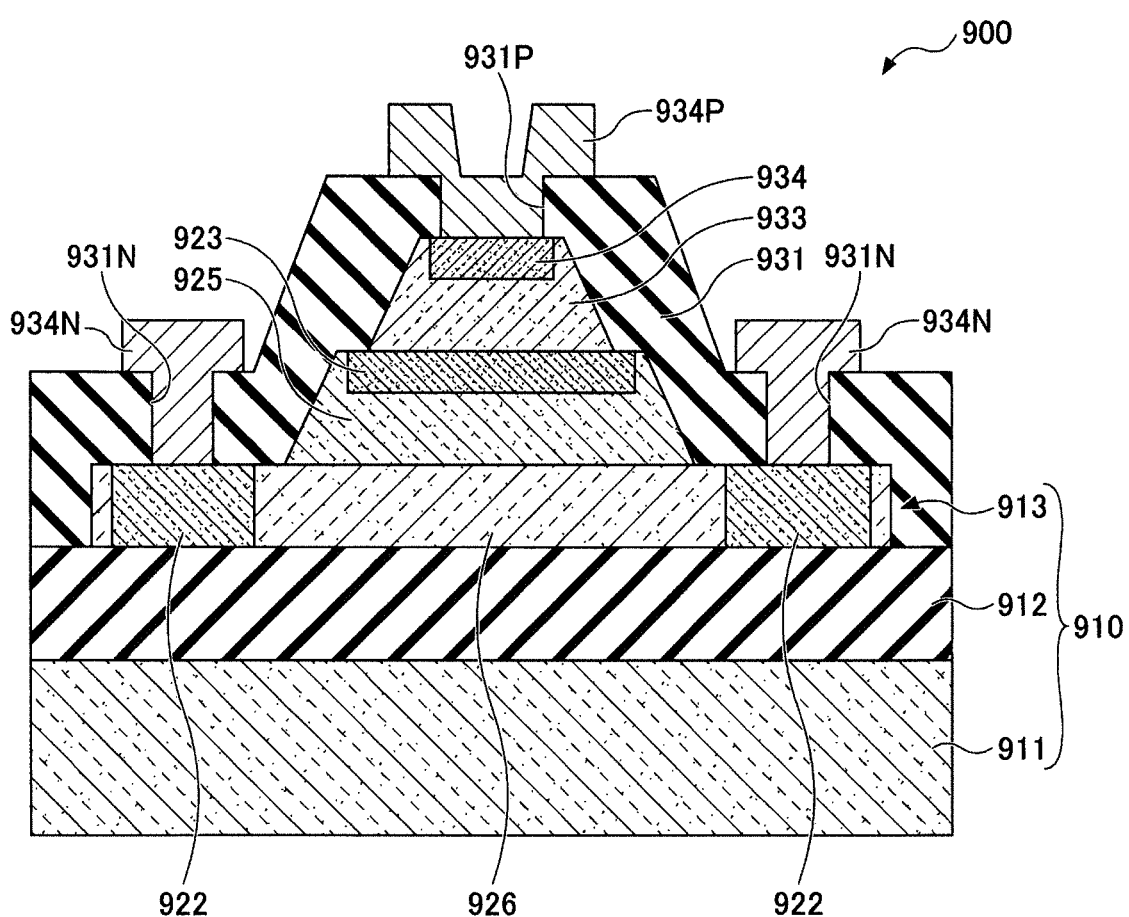
FIG. 1 is a cross-sectional view illustrating a configuration of an optical semiconductor device according to a reference example.

Among optical components, a portion that performs processing such as optical spectroscopy or modulation is required to have characteristics that do not absorb light in order to avoid excess loss. However, an optical receiver for converting an optical signal into an electrical signal (O/E conversion) needs to have a property of absorbing light. As a candidate material that satisfies these requirements, a combination of Ge as an optical receiver and Si as the other portions, with respect to near infrared light with a wavelength range of 1.2 µm to 1.6 µm, may be given. The near infrared light with such a wavelength range is transparent with respect to Si and is readily absorbed by Ge.

The efficiency of the O/E conversion is an important indicator for performance of an optical receiver. In photodiodes (PDs) that do not have a carrier multiplication function, such as a PIN PD, O/E conversion efficiency is determined by quantum efficiency, which is a ratio of the number of carriers that generate photocurrents to the number of photons that enter a photodetector. By contrast, avalanche photodiodes (APDs) are devices suitable for receiving weak optical signals because APDs have a photo-carrier multiplication function and are enabled to substantially increase O/E conversion efficiency. The principle of amplification in APD is of carrier multiplication by impact ionization. When a carrier generated by optical absorption in a depletion layer is accelerated by a strong electric field and has kinetic energy, a new electron-hole pair (carrier) is generated by impact ionization, upon collision with the crystal lattice. The transformation efficiency is amplified by avalanche-like amplification of the number of carriers through a chain reaction by which the generated carriers generate more new carriers.

In the following, two important indicators that characterize an operation of the APD, a breakdown voltage, and an ionization coefficient ratio, will be described. As a reverse voltage applied to a PN junction is increased, at a certain voltage, carrier generation by impact ionization increases rapidly and reverse current increases rapidly. This voltage is called a breakdown voltage. The breakdown voltage varies with materials and structures of the APD; however, a typical breakdown voltage of APDs is several times to several tens of times greater than a typical operating voltage of PIN PDs. Further, an ionization coefficient is referred to as the number of electron-hole pairs generated when a carrier (electron or hole) travels at unit distances, and the ionization coefficient varies with materials. The ionization coefficient is defined separately for each of electrons and holes, and a ratio of the two coefficients is called an ionization coefficient ratio. In general, the ionization coefficient ratio k is defined as an ionization coefficient $\beta$ of holes relative to an ionization coefficient $\alpha$ of electrons, which is represented by $k=\beta/\alpha$. In order to reduce the noise in APDs, it is desirable that the ionization coefficient $\alpha$ and the ionization coefficient $\beta$ are significantly different, i.e., it is desirable that the ionization coefficient ratio k should be significantly different from 1. If the ionization coefficients of electron and hole are close, the carriers will generate new carriers traveling opposite directions repeatedly. As a result, an excess noise will increase due to repeated reciprocation of the generated carriers.

While a hole-to-electron ionization coefficient ratio of Ge is approximately 2, that of Si is, though varying with the electric field strength, approximately 1/10 to 1/50, which indicates a large difference from 1. Thus, Si is preferred over Ge as a material for a carrier multiplication layer in APD.

With respect to low noise characteristics, one of the desirable APD structures is a SACM (Separated Absorption Charge and Multiplication) structure, which separates a light absorbing layer from the multiplication layer, in order to reduce excess noise.

REFERENCE EXAMPLE

In the following, a reference example of an APD employing a SACM structure in Si Photonics will be described. FIG. 1 is a cross-sectional view illustrating a configuration of an optical semiconductor device according to a reference example.

The optical semiconductor device 900 according to the reference example includes a silicon on insulator (SOI) substrate 910 including a silicon (Si) substrate 911, a silicon oxide layer 912, and a Si layer 913. The Si layer 913 includes an n-type Si region 926 and two $n^+$ Si regions 922, such that the n-type Si region 926 is interposed between the two $n^+$ Si regions 922 in planar view. The $n^+$ Si regions 922 contain n-type dopants at a higher concentration than the n-type Si region 926. An i-type Si layer 925 is formed on the n-type Si region 926, and a $p^-$ Si region 923 is formed on a surface of the i-type Si layer 925. An i-type germanium (Ge) layer 933 is formed on the $p^-$ Si region 923, and a $p^+$ Ge region 934 is formed on a surface of the i-type Ge layer 933. A silicon oxide layer 931 is formed to cover a stack, which is made up of the Si layer 913, the i-type Si layer 925 including a $p^-$ Si region 923, and the i-type Ge layer 933 including the $p^+$ Ge region 934. The silicon oxide layer 931 has openings 931N to reach the $n^+$ Si regions 922 and an opening 931P to reach the $p^+$ Ge region 934. A metal film 934N contacting the $n^+$ Si regions 922 through the openings 931N, and a metal film 934P contacting the $p^+$ Ge region 934 through the opening 931P are formed on the silicon oxide layer 931.

The optical semiconductor device 900 formed in this manner includes a stack of $p^+$ Ge region 934/i-type Ge layer 933/$p^-$ Si region 923/i-type Si layer 925/n-type Si region 926. The application of a reverse voltage to this stack causes electrons, from among the carriers generated by optical absorption in the i-type Ge layer 933, to be introduced into the i-type Si layer 925, where the introduced electrons are accelerated and amplified by the electric field of the i-type Si layer 925.

Note that light is incident on the i-type Ge layer 933 through the Si layer 913. That is, the optical semiconductor device 900 has the Si layer 913 as an optical waveguide, and light propagating through the Si layer 913 is incident on the i-type Ge layer 933 by evanescent light coupling. In this case, the i-type Ge layer 933 and the Si layer 913 are separated by the thicknesses of the i-type Si layer 925 and the $p^-$ Si region 923, and loss is likely to occur by this distance. This may reduce the opto-electric conversion efficiency. As a result, a signal-to-noise ratio of this device should be deteriorated.

In addition, since the metal film 934P is located behind the i-type Ge layer 933 from the viewpoint of the Si layer 913, a portion of light that has not been absorbed by the i-type Ge layer 933 will be absorbed by the metal film 934P. Since the optical absorption by the metal film 934P is ineffective absorption that does not produce effective photo-carriers, the opto-electric conversion efficiency is reduced.

Based on these reasons, sufficient opto-electric conversion efficiency will not be obtained in this reference example.

Furthermore, it may be difficult to fabricate the optical semiconductor device 900. In the following, a method of fabricating an optical semiconductor device 900 will be described. FIGS. 2A to 2E are cross-sectional views illustrating a method of fabricating an optical semiconductor device according to the reference example.

Figure 2A:
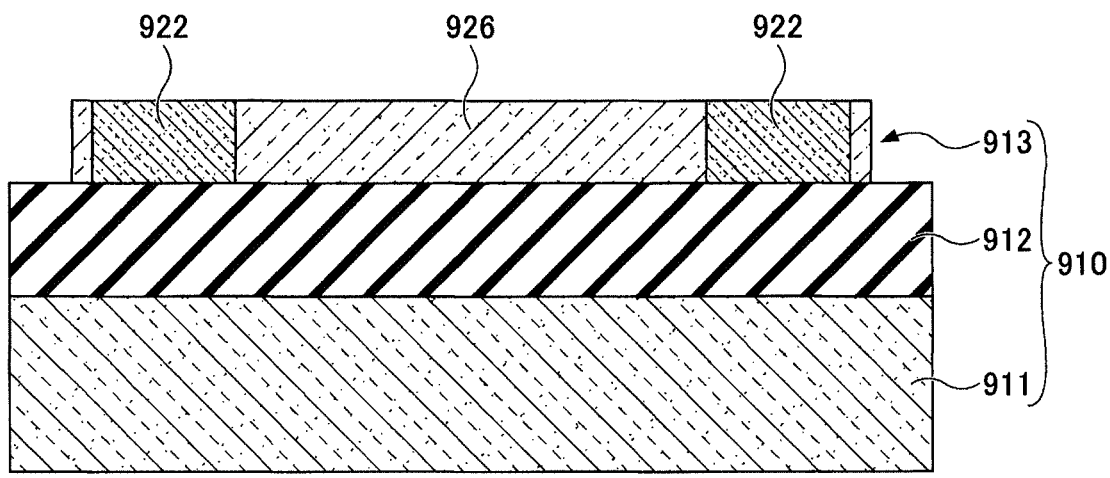
FIG. 2A is a cross-sectional view (1) illustrating a method of fabricating an optical semiconductor device according to a reference example.

First, as illustrated in FIG. 2A, a SOI substrate 910 is prepared, and a Si layer 913 is fabricated to a predetermined size. An n-type Si region 926 and $n^+$ Si regions 922 are formed by being doped with n-type dopants.

Figure 2B:
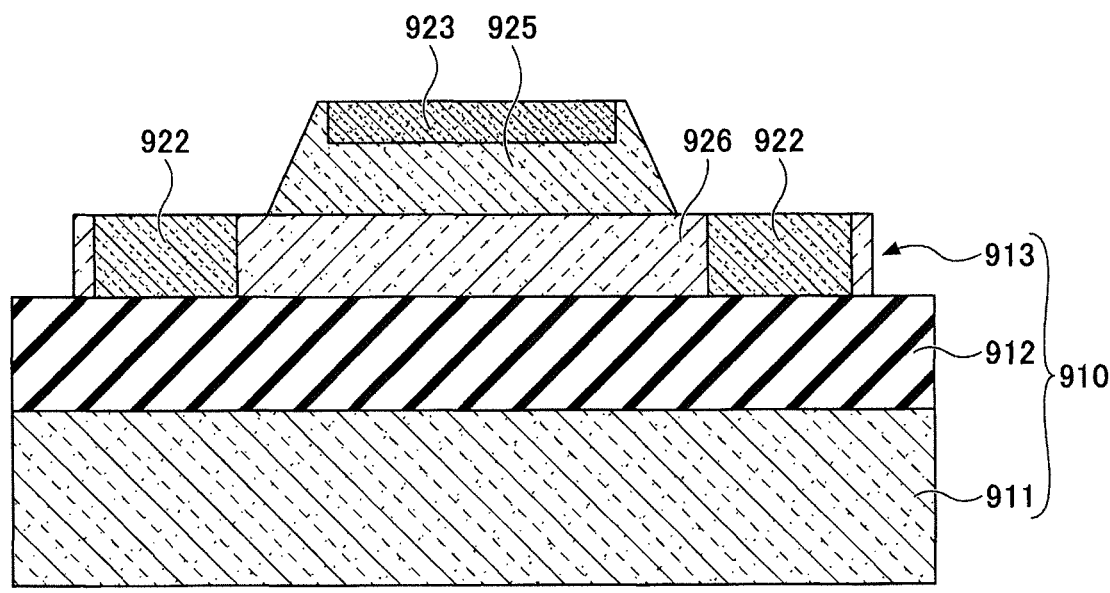
FIG. 2B is a cross-sectional view (2) illustrating a method of fabricating an optical semiconductor device according to a reference example.

Subsequently, as illustrated in FIG. 2B, an oxide mask (not illustrated) is used to form an i-type Si layer 925 by homoepitaxially and selectively growing Si crystal on the n-type Si region 926. A $p^-$ Si region 923 is then formed by doping the surface of the i-type Si layer 925 with p-type dopants. The dopants implanted into the Si layer 913 and the i-type Si layer 925, i.e., dopants included in the n-type Si region 926, $n^+$ Si regions 922, and $p^-$ Si region 923 are then subjected to high temperature annealing to be electrically activated. The thickness of the i-type Si layer 925 including the $p^-$ Si region 923 is approximately 700 nm.

Figure 2C:
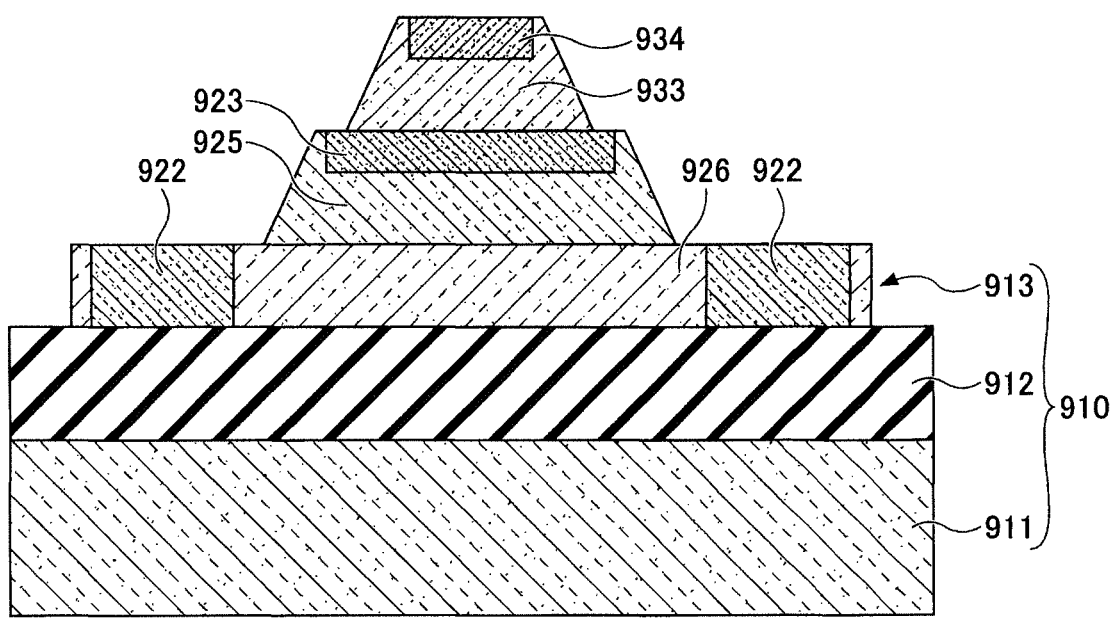
FIG. 2C is a cross-sectional view (3) illustrating a method of fabricating an optical semiconductor device according to a reference example.

Subsequently, as illustrated in FIG. 2C, another oxide mask (not illustrated) is used to form the i-type Ge layer 933 by heteroepitaxially and selectively growing Ge crystals on the $p^-$ Si region 923. A $p^+$ Ge region 934 is then formed by doping a surface of the i-type Ge layer 933 with p-type dopants. In addition, high temperature annealing is performed for the electrical activation of the dopants implanted into the i-type Ge layer 933, i.e., the dopants contained in the $p^+$ Ge region 934. Since the temperatures required for activation annealing differ between the Si and Ge layers, an annealing process for the Si and Ge layers needs to be performed separately. The thickness of the i-type Ge layer 933 including the $p^+$ Ge region 934 is approximately 1 µm.

Figure 2D:
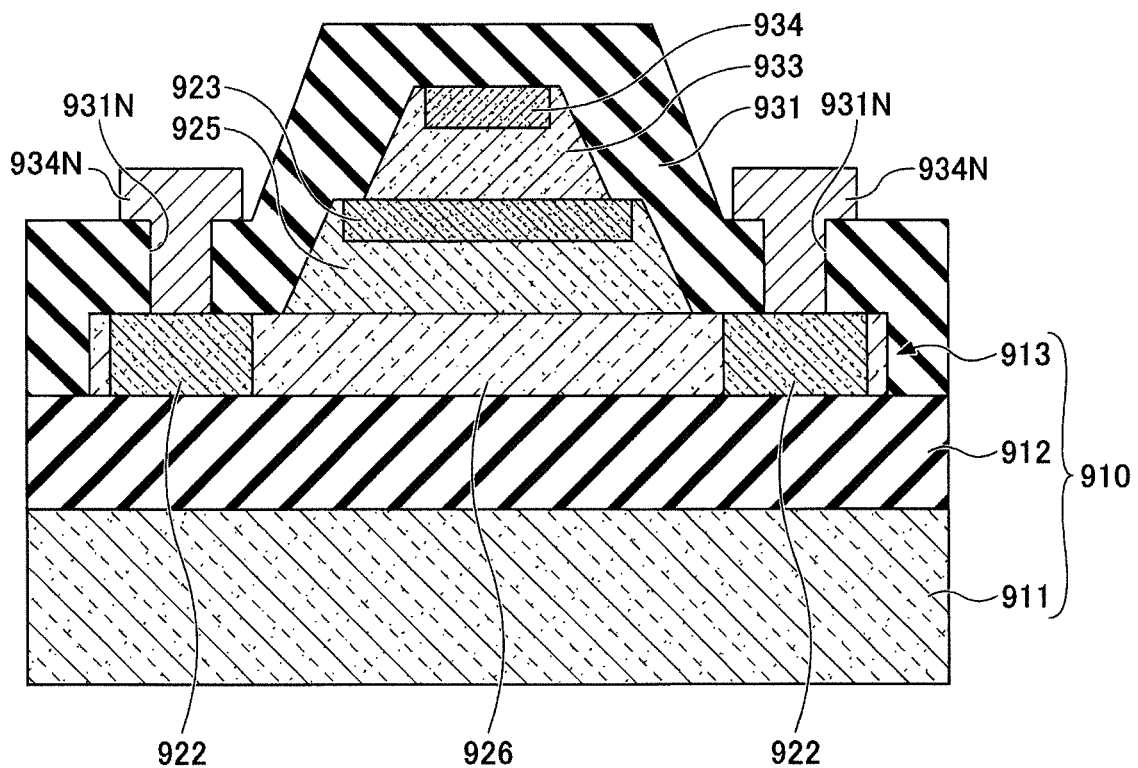
FIG. 2D is a cross-sectional view (4) illustrating a method of fabricating an optical semiconductor device according to a reference example.

Thereafter, as illustrated in FIG. 2D, a silicon oxide layer 931 is formed to cover a stack, which is made up of the Si layer 913, the i-type Si layer 925 including a $p^-$ Si region 923, and the i-type Ge layer 933 including the $p^+$ Ge region 934. Subsequently, openings 931N that reach the $n^+$ Si regions 922 are formed on the silicon oxide layer 931, and a metal film 934N that contacts the $n^+$ Si regions 922 through the openings 931N are formed on the silicon oxide layer 931.

Figure 2E:
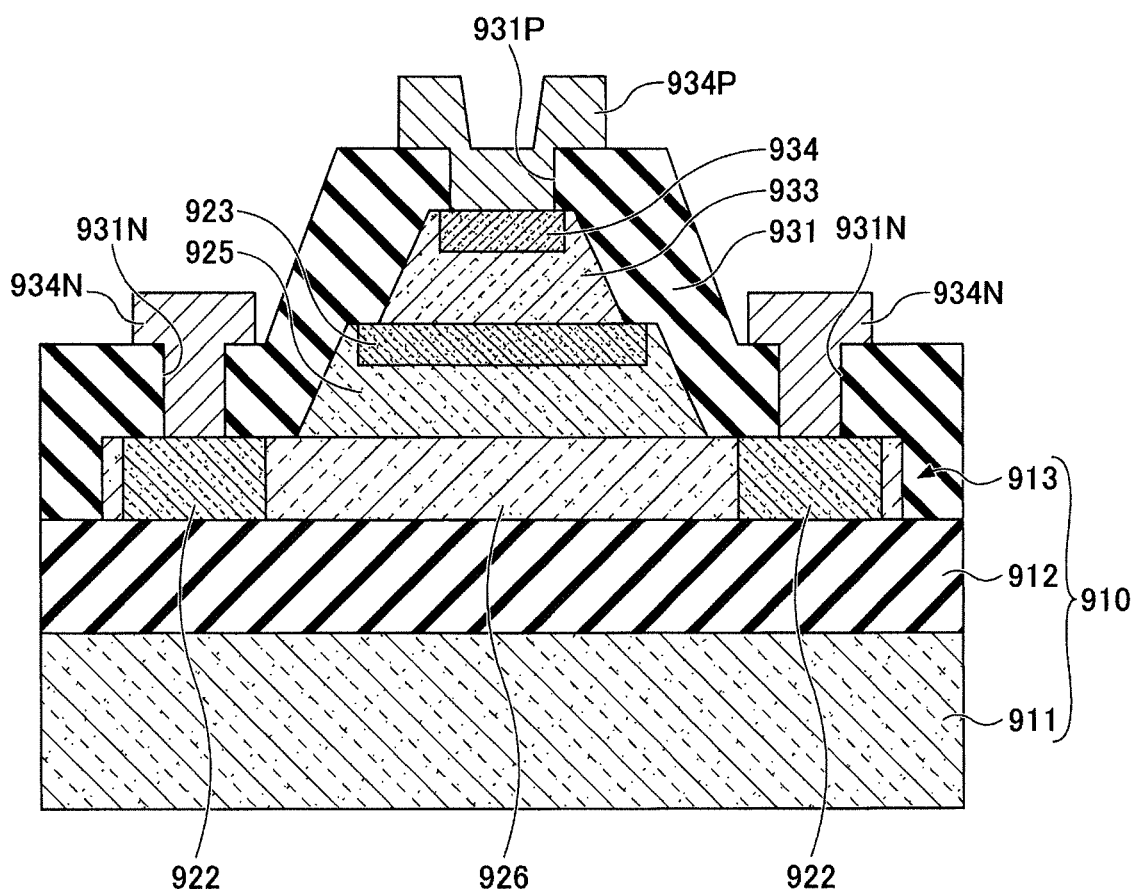
FIG. 2E is a cross-sectional view (5) illustrating a method of fabricating an optical semiconductor device according to a reference example.

Then, as illustrated in FIG. 2E, an opening 931P that reaches the $p^+$ Ge region 934 is formed on the silicon oxide layer 931, and a metal film 934P that contacts the $p^+$ Ge region 934 through the opening 931P is formed on the silicon oxide layer 931.

Theoretically, the optical semiconductor device 900 may be fabricated in this manner.

With respective to the above, although Si photonics has the advantage of being enabled to employ a high-precision process technology used in the fabrication of a Si-based CMOS (Complementary Metal-oxide-Semiconductor) transistor, the above-described fabricating method according to the reference example is unable to employ such a high-precision process technology. This is because there is a large step difference associated with the i-type Si layer 925 and the i-type Ge layer 933. In a high precision process technology, exposure is typically performed using a stepper or the like with a small focal depth, such that the larger the step difference present on the substrate, the greater the degradation in focus. As described above, the thickness of the i-type Si layer 925 including the p⁻ Si region 923 is approximately 700 nm, and the thickness of the i-type Ge layer 933 including the p⁺ Ge region 934 is approximately 1 μm; the step difference associated with these layers is thus extremely large. Accordingly, the focus will be degraded as exposure is performed with the presence of the large step difference associated with the i-type Si layer 925 or the i-type Ge layer 933 on the substrate. In addition, a photoresist employed in the high precision process may fail to completely cover the large step difference due to its low viscosity. Thus, it may be extremely difficult to fabricate the optical semiconductor device 900 with high precision.

It is generally preferable that a device capacitance of the APD be small in terms of operating speed. The device capacitance of the APD depends primarily on the shape of the depletion layer (i-type semiconductor layer), is inversely proportional to depletion layer thickness and is proportional to a cross-sectional area. In the optical semiconductor device 900, the i-type Ge layer 933 corresponds to the depletion layer, and the i-type Ge layer 933 is interposed between the p⁺ Ge region 934 and the n-type Si region 926 in the thickness direction of the SOI substrate 910. Thus, the device capacitance decreases as the thickness of the i-type Ge layer 933 increases in the thickness direction of the SOI substrate 910. Accordingly, it is preferable that the i-type Ge layer 933 be thick in order to reduce device capacitance. In addition, the i-type Ge layer 933 also requires a thickness for the p⁺ Ge region 934. Thus, a required thickness of the i-type Ge layer 933 including the p⁺ Ge region 934 is approximately 1 μm. The i-type Si layer 925 also requires a thickness for multiplication functions, and a required thickness of the i-type Si layer 925 including the p⁻ Si region 923 is approximately 700 nm.

Further, a p⁺ Ge region 934 is formed for ohmic contact by being doped with the p-type dopants; however, it is not easy to control thermal budget including doping and activation annealing of the Ge layer under conditions in which an appropriate impurity profile is obtained in the thickness direction. Since the temperature required for dopant activation of the Ge layer is lower than the temperature required for dopant activation of the Si layer, the effect of thermal budget during a process of forming the oxide film or forming the electrode may also need to be considered. Accordingly, there may be a constraint on a device to be used for forming an oxide film or an electrode. For example, deep diffusion of p-type dopants into the i-type Ge layer 933 due to the activated annealing and thermal budget affects optical absorption by the i-type Ge layer 933.

Thus, the optical semiconductor device 900 according to the reference example may be improved with respect to its properties and fabricating processes. The inventors of the present invention have conducted a thorough investigation based on these findings, and have achieved the following embodiments. The following illustrates embodiments in detail with reference to the accompanying drawings. In the following description, the same or corresponding elements may be provided with identical signs, and the duplicated descriptions of such elements may be omitted.

(First Embodiment)

Figure 3A:
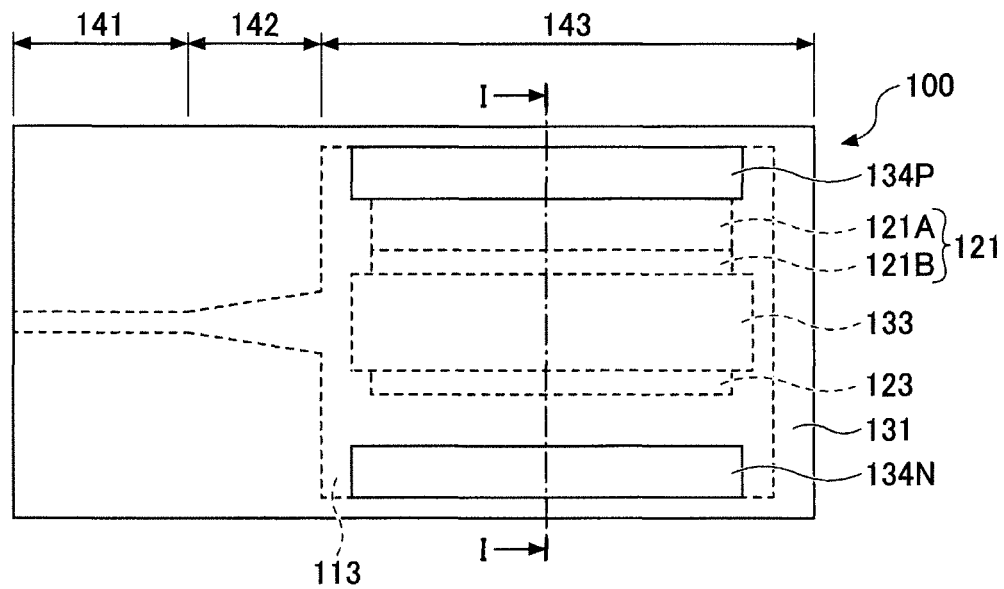
FIG. 3A is a top view illustrating a configuration of an optical semiconductor device according to a first embodiment.
Figure 3B:
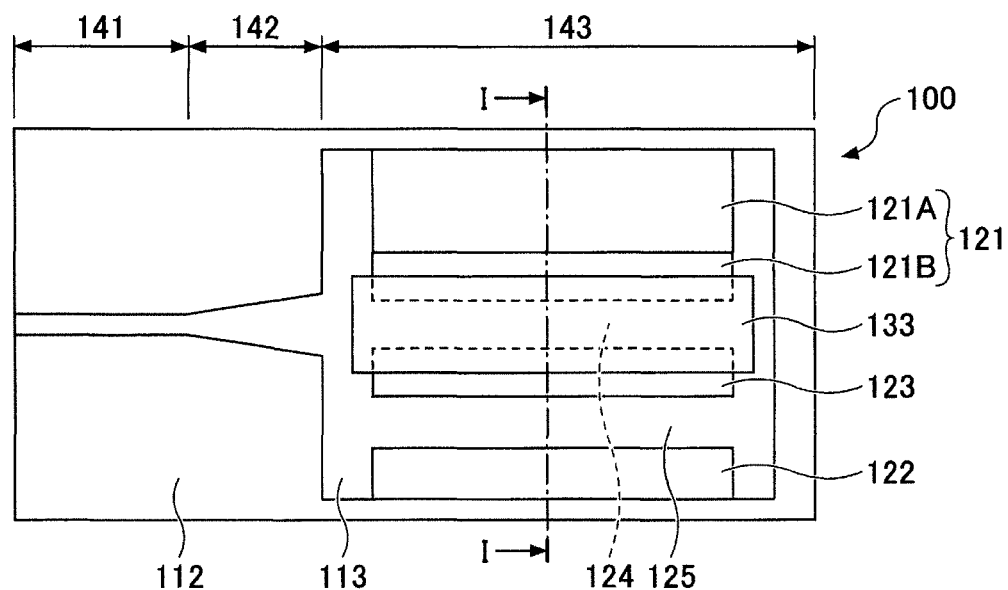
FIG. 3B is a diagram illustrating a layout of semiconductor regions in an optical semiconductor device according to the first embodiment.
Figure 3C:
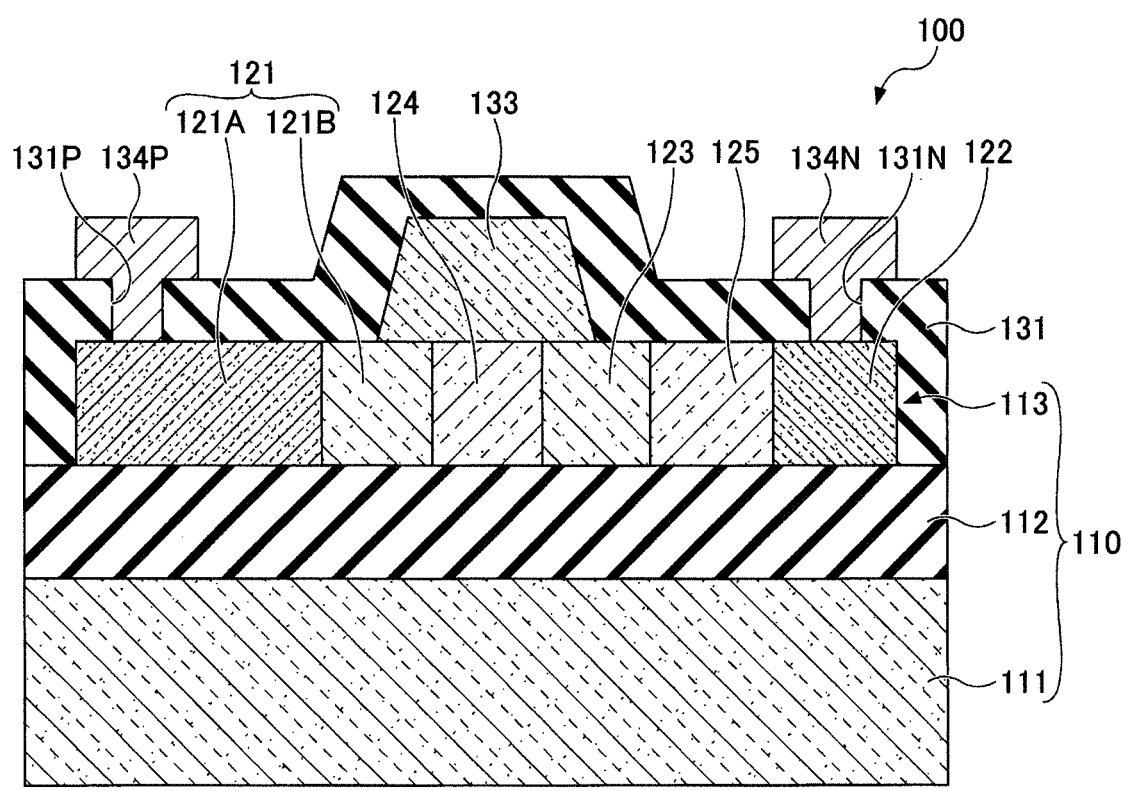
FIG. 3C is a cross-sectional view illustrating a configuration of an optical semiconductor device according to the first embodiment.

A first embodiment will be described as follows. The first embodiment relates to an optical semiconductor device 100 including an APD. FIG. 3A is a top view illustrating a configuration of an optical semiconductor device 100 according to the first embodiment. FIG. 3B is a diagram illustrating a layout of semiconductor regions in the optical semiconductor device 100 according to the first embodiment. FIG. 3C is a cross-sectional view illustrating a configuration of the optical semiconductor device 100 according to the first embodiment. FIG. 3C corresponds to a cross-sectional view along the I-I line in FIGS. 3A and 3B.

As illustrated in FIGS. 3A to 3C, the optical semiconductor device 100 according to the first embodiment includes a SOI substrate 110 having a Si substrate 111, a silicon oxide layer 112, and a Si layer 113. The optical semiconductor device 100 includes a waveguide region 141, a mode converter 142, and a opto-electric converter 143. In the waveguide region 141, the Si layer 113 is fabricated into a shape of an optical waveguide. In the mode converter 142, the Si layer 113 is fabricated into a shape of an optical mode converter.

In the opto-electric converter 143, the Si layer 113 is fabricated into a rectangular planar shape, for example. The Si layer 113 includes a p⁺ Si region 121A, a p⁻ Si region 121B, an i-type Si region 124, a p⁻ Si region 123, an i-type Si region 125, and an n⁺ Si region 122 that are disposed in a direction perpendicular to a direction of light incident onto the opto-electric converter 143. The p⁺ Si region 121A and the p⁻ Si region 121B are included in the p-type region 121. The p⁻ Si region 123 is disposed between the p-type region 121 and the n⁺ Si region 122, the i-type Si region 124 is disposed between the p-type region 121 and the p⁻ Si region 123, and the i-type Si region 125 is disposed between the n⁺ Si region 122 and the p⁻ Si region 123. For example, a p⁺ Si region 121A contains boron (B) at a concentration of $1.5 \times 10^{19}$ cm$^{-3}$ to $2.5 \times 10^{19}$ cm$^{-3}$. For example, a p⁻ Si region 121B contains B at a concentration of $1.5 \times 10^{18}$ cm$^{-3}$ to $2.5 \times 10^{18}$ cm$^{-3}$. For example, a p⁻ Si region 123 contains B at a concentration of $0.5 \times 10^{18}$ cm$^{-3}$ to $1.5 \times 10^{18}$ cm$^{-3}$. For example, an n⁺ Si region 122 contains phosphorus (P) at concentrations of $0.5 \times 10^{19}$ cm$^{-3}$ to $1.5 \times 10^{19}$ cm$^{-3}$. The p-type region 121 is an example of a first region. The n⁺ Si region 122 is an example of a second region. The p⁻ Si region 123 is an example of a third region. The i-type Si region 124 is an example of a fourth region. The i-type Si region 125 is an example of a fifth region. The p⁺ Si region 121A contains p-type dopants at higher concentrations than p⁻ Si region 121B, the p⁺ Si region 121A is an example of a sixth region, and the p⁻ Si region 121B is an example of a seventh region.

An i-type Ge layer 133 is formed on the p⁻ Si region 121B, the i-type Si region 124, and the p⁻ Si region 123. The refractive index and optical absorption coefficient of the i-type Ge layer 133 are greater than the refractive index and optical absorption coefficient of the Si layer 113.

Although the i-type semiconductor layer is not intentionally doped with dopants, the i-type semiconductor layer may contain minor dopants, e.g., dopants at a concentration of $1 \times 10^{15}$ cm$^{-3}$ or less.

A silicon oxide layer 131 is formed to cover a stack made up of the Si layer 113 and the i-type Ge layer 133. The silicon oxide layer 131 has an opening 131P reaching the p⁺ Si region 121A and an opening 131N reaching the n⁺ Si region 122. A metal film 134P in ohmic contact with the p⁺ Si region 121A through the opening 131P and a metal film 134N in ohmic contact with the n⁺ Si region 122 through the opening 131N are formed on the silicon oxide layer 131. The metal film 134P and metal film 134N include, for example, aluminum (Al).

The optical semiconductor device 100 formed in this manner includes a SACM structured APD of a p-type region 121 (p⁺ Si region 121A and p⁻ Si region 121B), an i-type Si region 124, a p⁻ Si region 123, an i-type Si region 125, and an n⁺ Si region 122, which are electrically disposed in series between the metal film 134P and the metal film 134N. The application of a reverse voltage to the APD structure causes electrons, from among the carriers generated by optical absorption in the i-type Ge layer 133, to be introduced into the i-type Si region 125, and the introduced electrons are accelerated and amplified by the electric field in the i-type Si region 125. That is, the i-type Ge layer 133 serves as a light absorbing layer and the i-type Si region 125 serves as a carrier (electron) multiplication layer.

Since the i-type Ge layer 133 is in direct contact with the Si layer 113, a loss upon light propagating from the Si layer 113 to the i-type Ge layer 133 is small, an excellent mode coupling property is obtained, and a high optical responsivity is also obtained. In addition, since a metal film need not be in contact with the i-type Ge layer 133, ineffective optical absorption by the metal film, such as that observed in the optical semiconductor device 900, will be prevented, and a decrease in the optical responsivity due to such ineffective absorption will be prevented.

In this embodiment, with respect to the device capacitance of the APD, the i-type Ge layer 133 corresponds to the depletion layer, and the i-type Ge layer 133 is interposed between the p-type region 121 and the n$^+$ Si region 122 in a direction parallel to a surface of the SOI substrate 110. As noted above, the device capacitance of the APD is inversely proportional to depletion layer thickness and is proportional to the cross-sectional area. Accordingly, in this embodiment, the cross-sectional area and the device capacitance decrease as the thickness of the i-type Ge layer 133 is reduced in the thickness direction of the SOI substrate 110. In addition, the device capacitance decreases as the length in a direction parallel to the surface of the SOI substrate 110 of the i-type Ge layer 133 increases. Thus, in view of operating speed, the i-type Ge layer 133 is preferably thin, and the structure of the present embodiment is suitable for high precision process technologies.

Further, in the present embodiment, the light propagation mode, which is strongly confined in the optical waveguide of the waveguide region 141, is expanded by the mode converter 142 to improve the coupling to the i-type Ge layer 133. Accordingly, optical responsivity can be improved significantly by this embodiment.

Further, as will be described below, the fabrication process of this embodiment is simpler than that of the reference optical semiconductor device 900. FIGS. 4A to 16A are top views illustrating a method of fabricating an optical semiconductor device 100 according to the first embodiment, and FIGS. 4B to 16B are cross-sectional views illustrating a method of fabricating an optical semiconductor device 100 according to the first embodiment. FIGS. 4B to 16B correspond to cross-sectional views along I-I lines in FIGS. 4A to 16A, respectively.

Figure 4A:
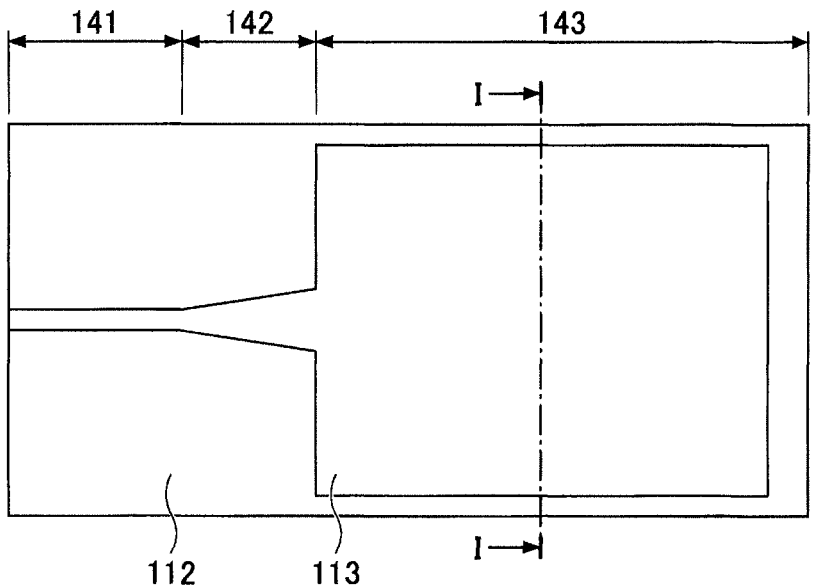
FIG. 4A is a top view (1) illustrating a method of fabricating an optical semiconductor device according to the first embodiment.
Figure 4B:
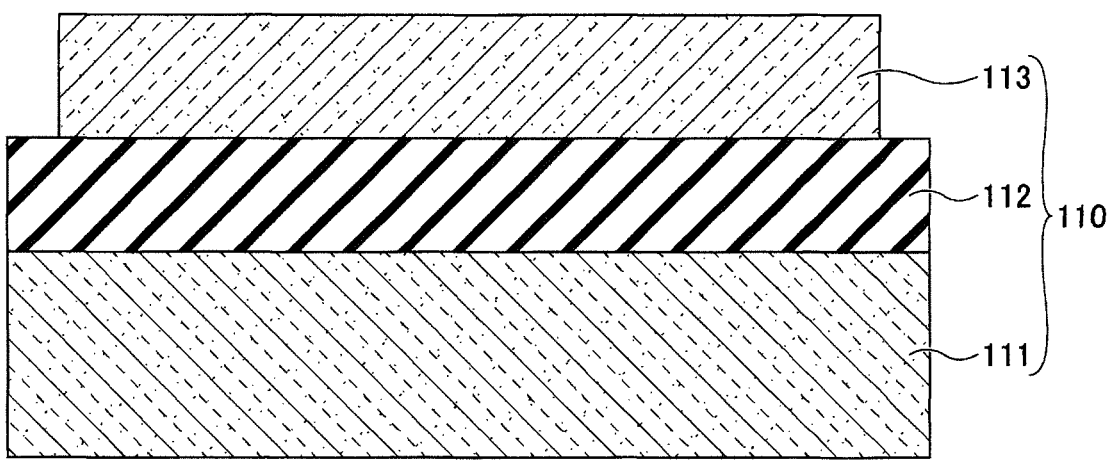
FIG. 4B is a cross-sectional view (1) illustrating a method of fabricating an optical semiconductor device according to the first embodiment.

First, as illustrated in FIGS. 4A and 4B, the SOI substrate 110 is prepared and the Si layer 113 is fabricated. For example, the thickness of the Si substrate 111 is 400 μm to 600 μm, the thickness of the silicon oxide layer 112 is 1.5 μm to 2.5 μm, and the thickness of the Si layer 113 is 200 nm to 300 nm. The Si layer 113 may be processed by electron beam (EB) lithography and inductively coupled plasma (ICP) dry etching. For example, the Si layer 113 is processed in a straight line extending in one direction in the waveguide region 141, and the mode converter 142 is processed in a planar shape extending from the waveguide region 141 to the opto-electric converter 143, and the opto-electric converter 143 is processed in a rectangular planar shape.

Figure 5A:
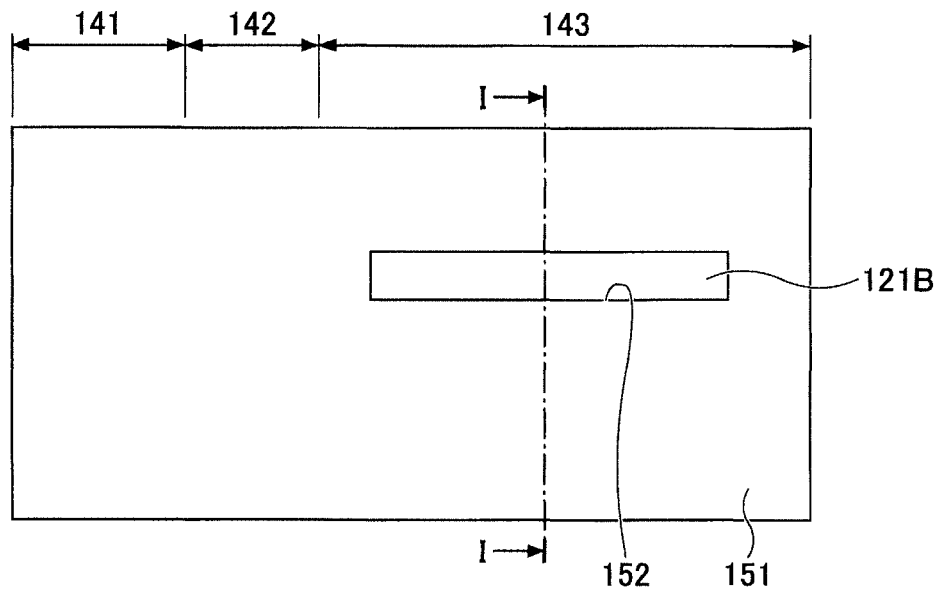
FIG. 5A is a top view (2) illustrating a method of fabricating an optical semiconductor device according to the first embodiment.
Figure 5B:
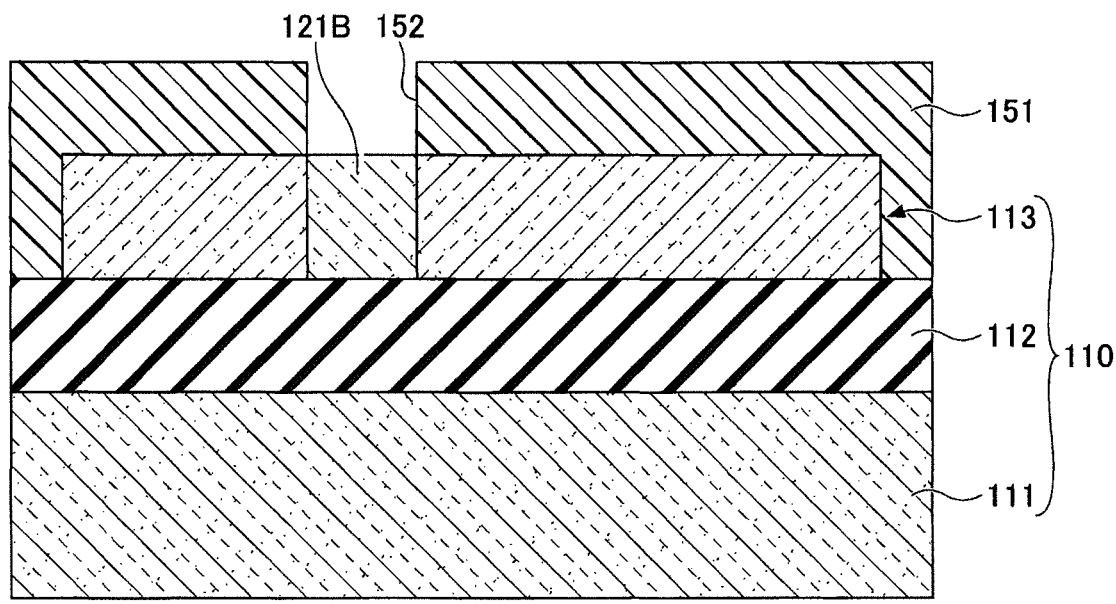
FIG. 5B is a cross-sectional view (2) illustrating a method of fabricating an optical semiconductor device according to the first embodiment.

As illustrated in FIGS. 5A and 5B, the photoresist mask 151 is then formed on the SOI substrate 110 with an opening 152 that opens a region for forming the p$^-$ Si region 121B. The photoresist mask 151 may be formed by the photolithography including application, exposure, and development of a photoresist. Thereafter, a p$^-$ Si region 121B is formed in the Si layer 113 by ion implantation of the p-type dopants.

Figure 6A:
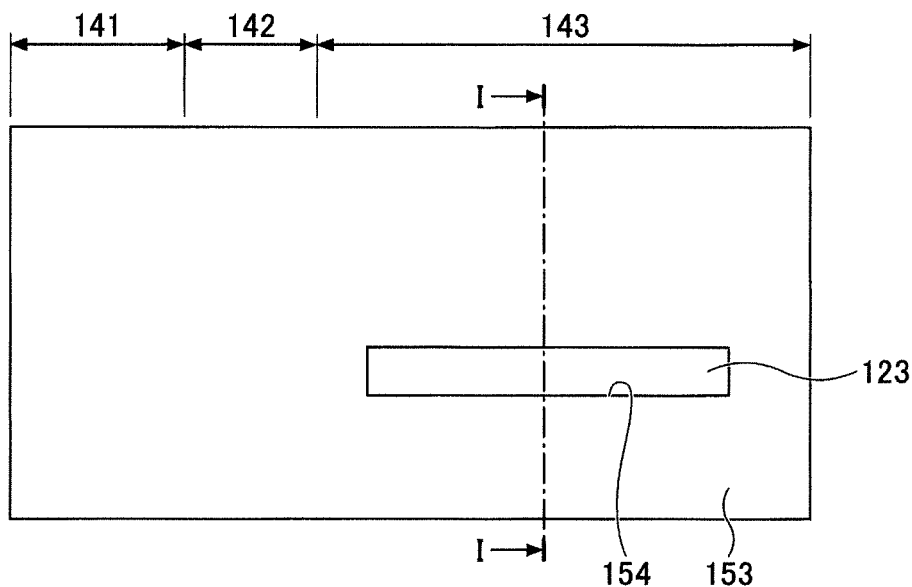
FIG. 6A is a top view (3) illustrating a method of fabricating an optical semiconductor device according to the first embodiment.
Figure 6B:
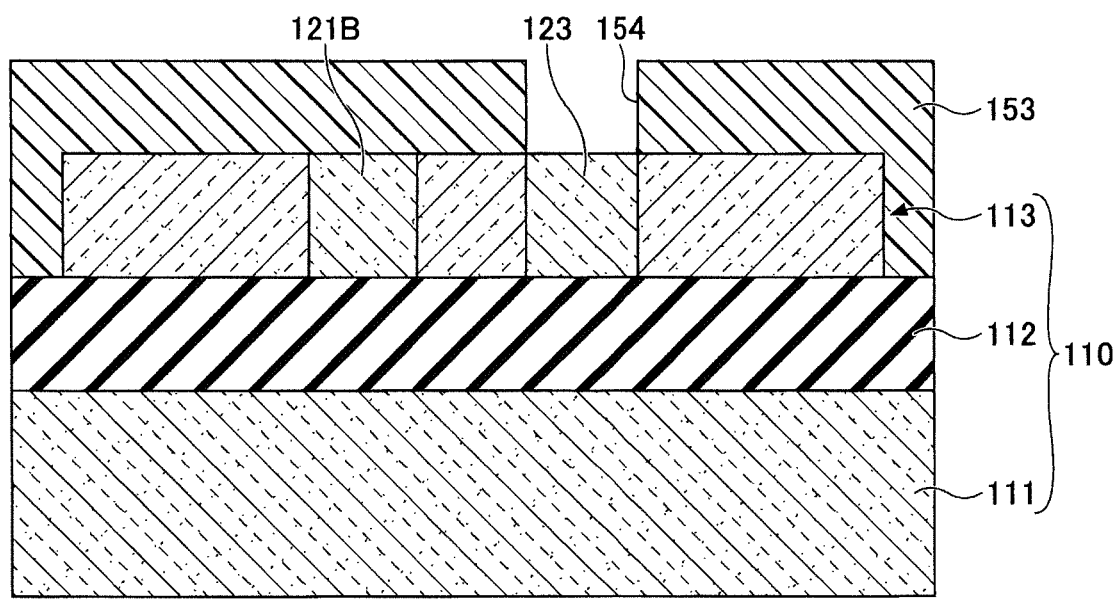
FIG. 6B is a cross-sectional view (3) illustrating a method of fabricating an optical semiconductor device according to the first embodiment.

Subsequently, as illustrated in FIGS. 6A and 6B, the photoresist mask 151 is removed, and a photoresist mask 153 with an opening 154 that opens a region for forming the p$^-$ Si region 123 is formed on the SOI substrate 110. The photoresist mask 153 may be formed by the photolithography including application, exposure, and development of a photoresist. Subsequently, the p$^-$ Si region 123 is then formed in the Si layer 113 by ion implantation of the p-type dopants.

Figure 7A:
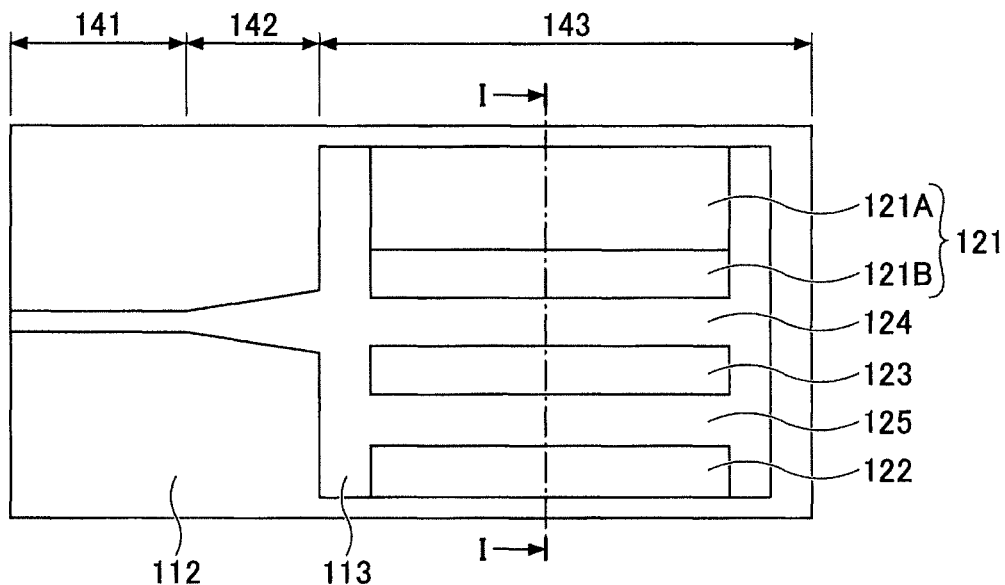
FIG. 7A is a top view (4) illustrating a method of fabricating an optical semiconductor device according to the first embodiment.
Figure 7B:
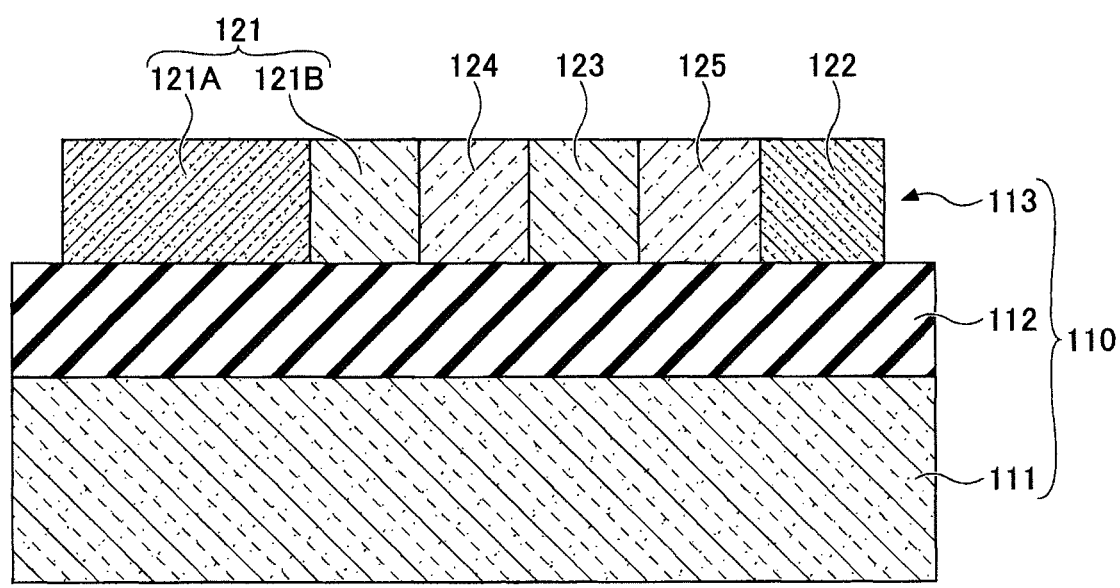
FIG. 7B is a cross-sectional view (4) illustrating a method of fabricating an optical semiconductor device according to the first embodiment.

The photoresist mask 153 is then removed as illustrated in FIGS. 7A and 7B. Subsequently, photoresist mask formation, ion implantation, and removal of the photoresist mask are performed twice, in a manner similar to formation of the p$^-$ Si region 121B or formation of the p$^-$ Si region 123, to form the p$^+$ Si region 121A and the n$^+$ Si region 122. Of the Si layer 113, an intervening region between the p$^-$ Si region 121B and the p$^-$ Si region 123 corresponds to the i-type Si region 124, and an intervening region between the p$^-$ Si region 123 and the n$^+$ Si region 122 corresponds to the i-type Si region 125.

Figure 8A:
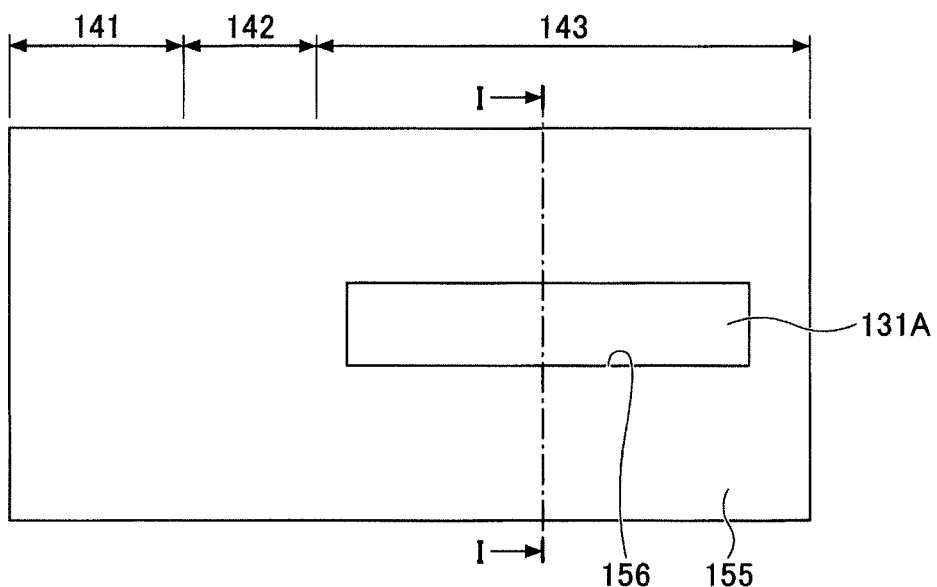
FIG. 8A is a top view (5) illustrating a method of fabricating an optical semiconductor device according to the first embodiment.
Figure 8B:
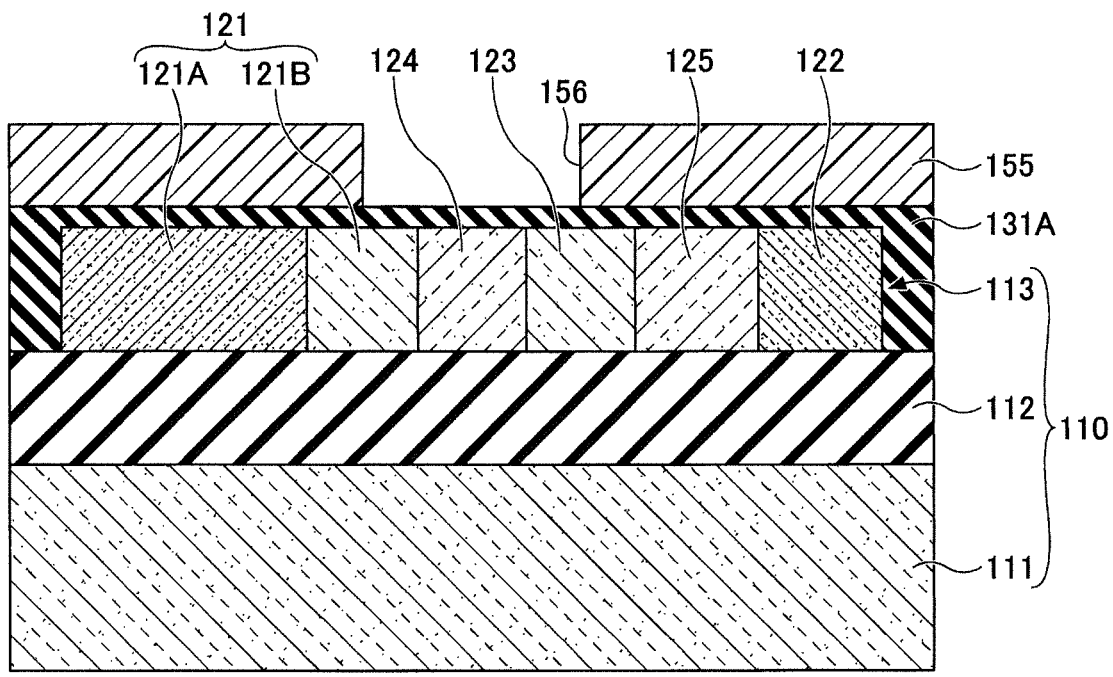
FIG. 8B is a cross-sectional view (5) illustrating a method of fabricating an optical semiconductor device according to the first embodiment.

Subsequently, as illustrated in FIGS. 8A and 8B, a silicon oxide layer 131A is formed on the SOI substrate 110. The silicon oxide layer 131A may be formed, for example, by chemical vapor deposition (CVD) methods, with a thickness of the silicon oxide layer 131A ranging from 15 nm to 25 nm. Thereafter, high temperature annealing activates the p-type dopants and n-type dopants implanted into the Si layer 113. The annealing is carried out at a temperature of, for example, 900° C. to 1100° C. for 0.5 minutes to 2 minutes.

Thereafter, as also illustrated in FIGS. 8A and 8B, a photoresist mask 155 with an opening 156 that opens a region for forming the i-type Ge layer 133 is formed on the silicon oxide layer 131A. The photoresist mask 155 may be formed by the photolithography including application, exposure, and development of a photoresist. For example, the overall length of the opening 156 is 25 μm to 35 μm, and the overall width of the opening 156 is 1.5 μm to 2.5 μm.

Figure 9A:
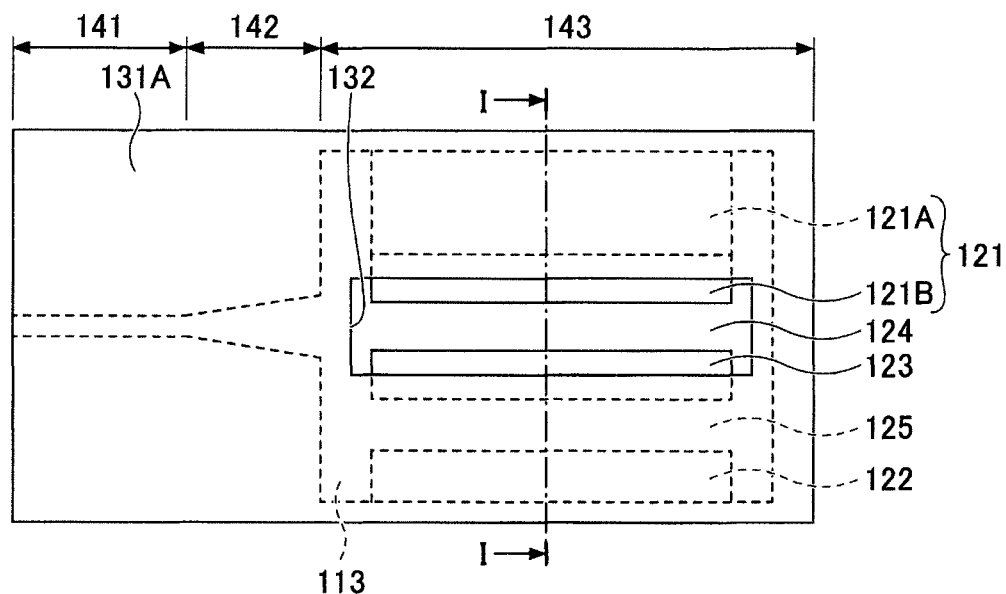
FIG. 9A is a top view (6) illustrating a method of fabricating an optical semiconductor device according to the first embodiment.
Figure 9B:
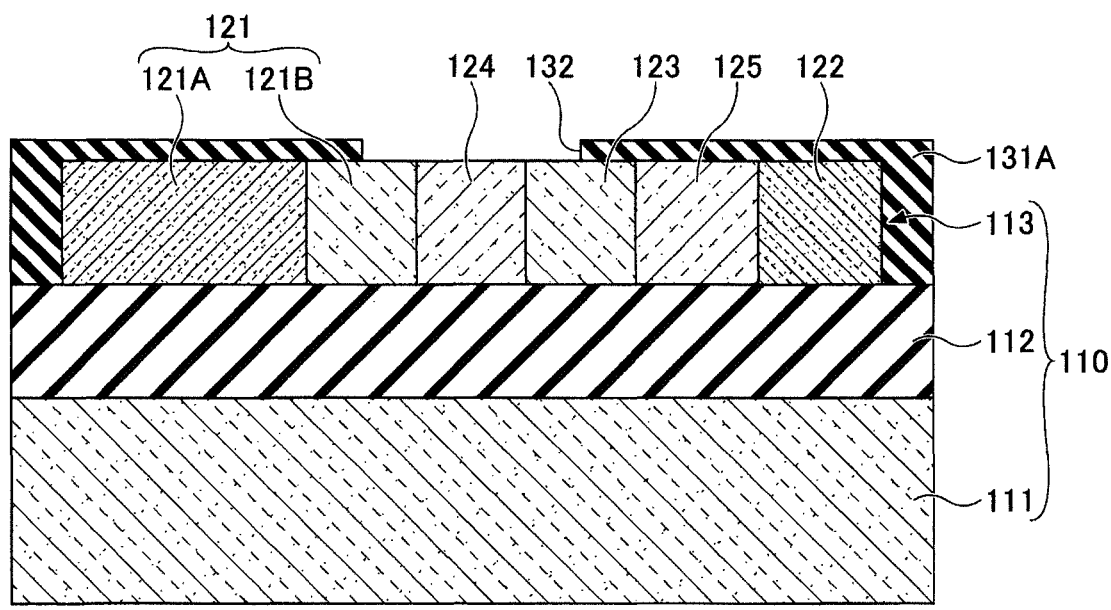
FIG. 9B is a cross-sectional view (6) illustrating a method of fabricating an optical semiconductor device according to the first embodiment.

Subsequently, as illustrated in FIGS. 9A and 9B, an opening 132 is formed in the silicon oxide layer 131A by dry etching of the silicon oxide layer 131A. The photoresist mask 155 is then removed.

Figure 10A:
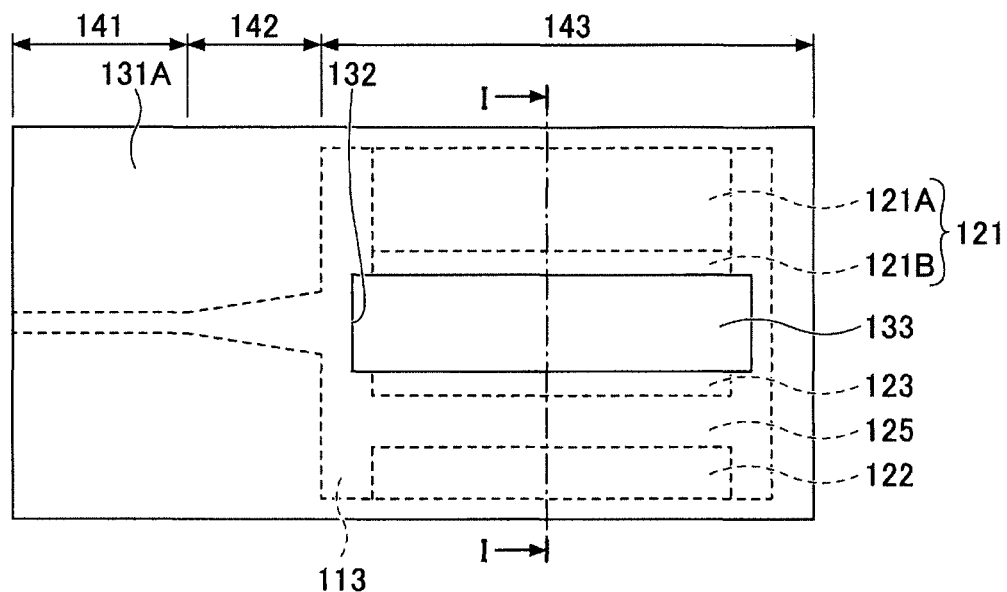
FIG. 10A is a top view (7) illustrating a method of fabricating an optical semiconductor device according to the first embodiment.
Figure 10B:
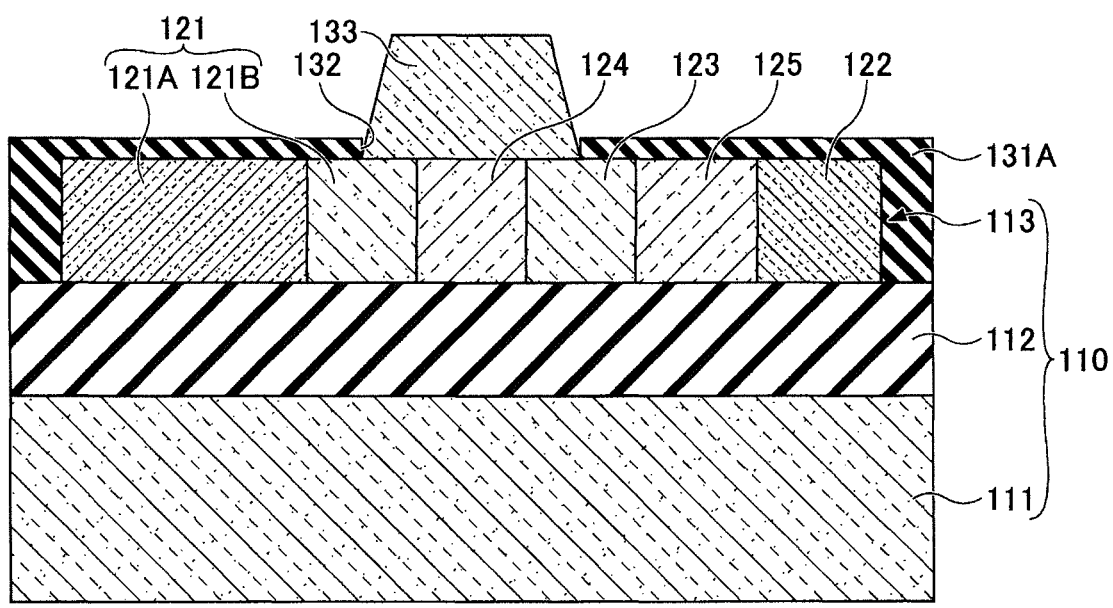
FIG. 10B is a cross-sectional view (7) illustrating a method of fabricating an optical semiconductor device according to the first embodiment.

Thereafter, as illustrated in FIGS. 10A and 10B, an i-type Ge layer 133 is formed on the Si layer 113 inside the opening 132. The i-type Ge layer 133 may be formed, for example, by a low pressure (LP) CVD process, with a thickness of 150 nm to 250 nm. For example, the i-type Ge layer 133 is heteroepitaxially grown in a mesa-like shape.

Figure 11A:
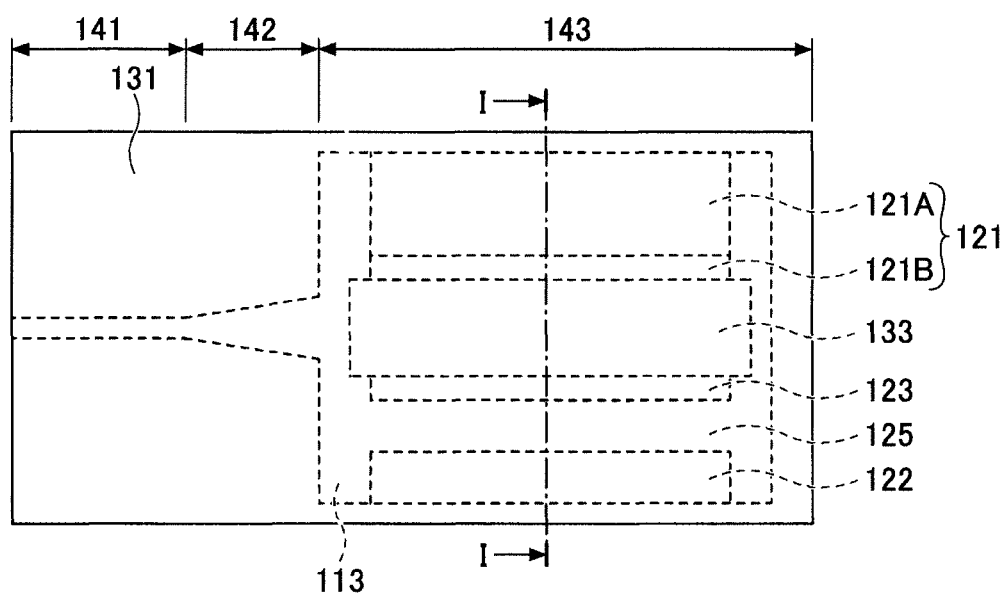
FIG. 11A is a top view (8) illustrating a method of fabricating an optical semiconductor device according to the first embodiment.
Figure 11B:
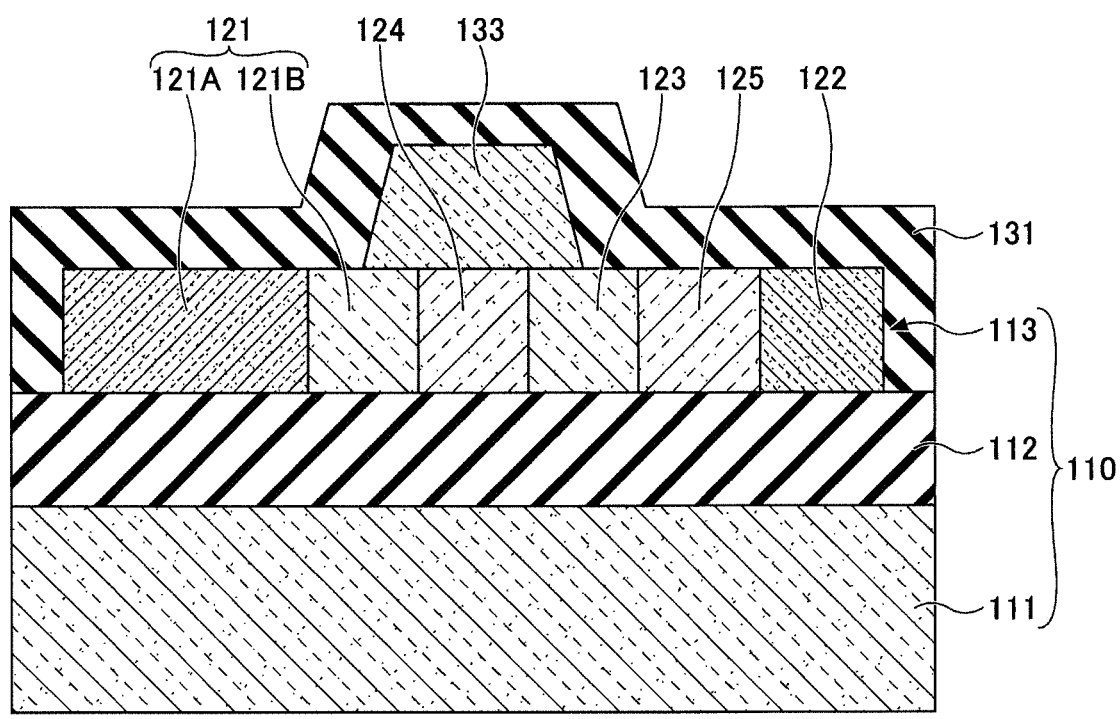
FIG. 11B is a cross-sectional view (8) illustrating a method of fabricating an optical semiconductor device according to the first embodiment.

Next, as illustrated in FIGS. 11A and 11B, a silicon oxide layer 131 is formed on the silicon oxide layer 131A to cover the i-type Ge layer 133 by, for example, a CVD method to form the silicon oxide layer 131 including the silicon oxide layer 131A.

Figure 12A:
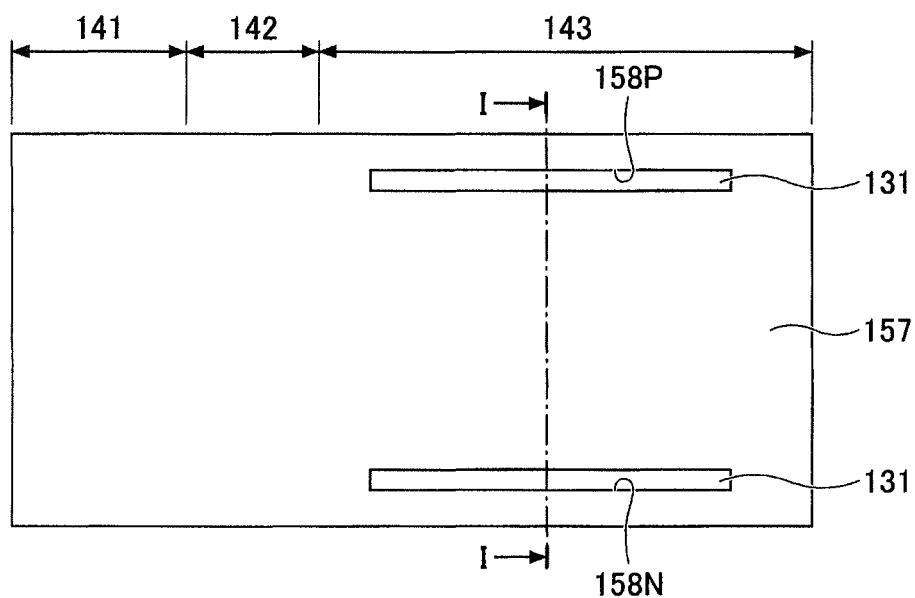
FIG. 12A is a top view (9) illustrating a method of fabricating an optical semiconductor device according to the first embodiment.
Figure 12B:
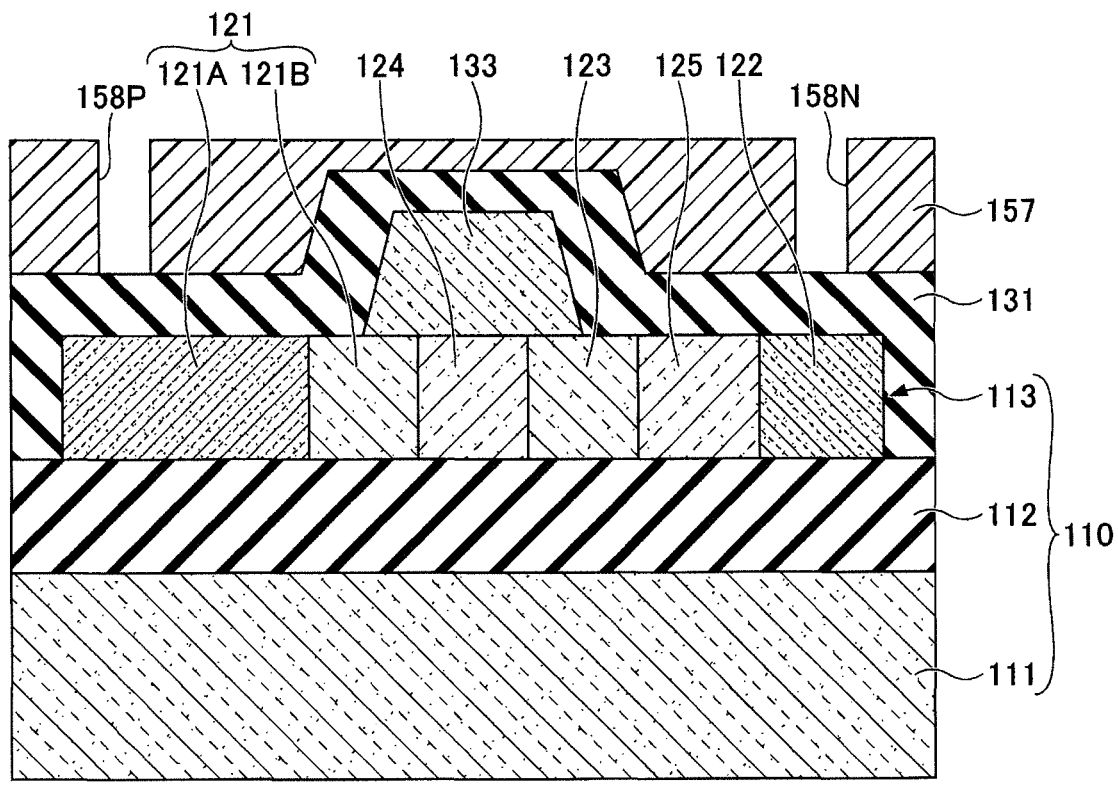
FIG. 12B is a cross-sectional view (9) illustrating a method of fabricating an optical semiconductor device according to the first embodiment.

Thereafter, as illustrated in FIGS. 12A and 12B, a photoresist mask 157 is formed on the silicon oxide layer 131 with an opening 158P that opens a region for forming the opening 131P and with an opening 158N that opens a region for forming the opening 131N. The photoresist mask 157 may be formed by the photolithography including application, exposure, and development of a photoresist. Since the thickness of the i-type Ge layer 133 is as thin as 150 nm to 250 nm, exposure may be performed with high accuracy.

Figure 13A:
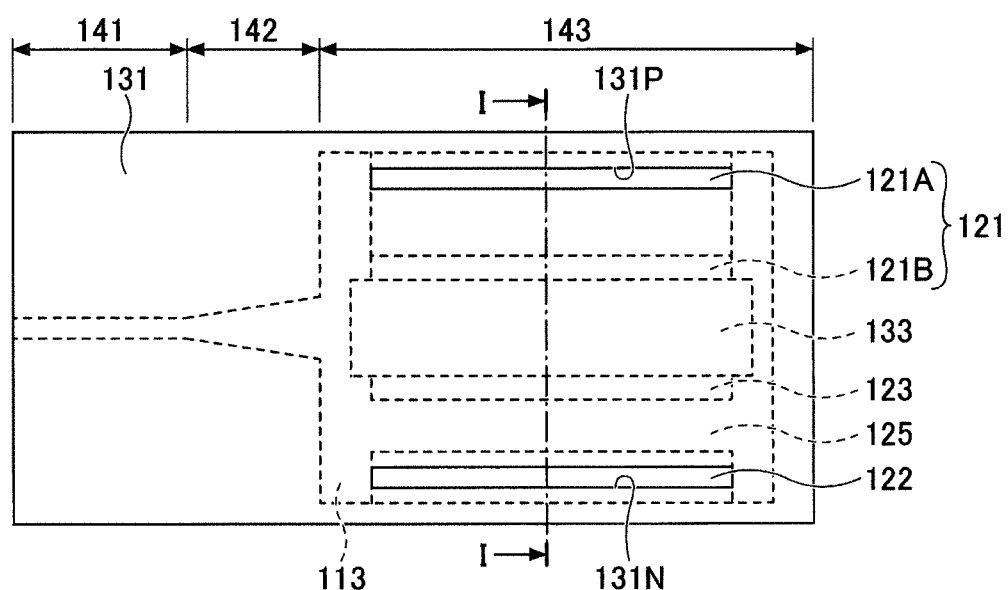
FIG. 13A is a top view (10) illustrating a method of fabricating an optical semiconductor device according to the first embodiment.
Figure 13B:
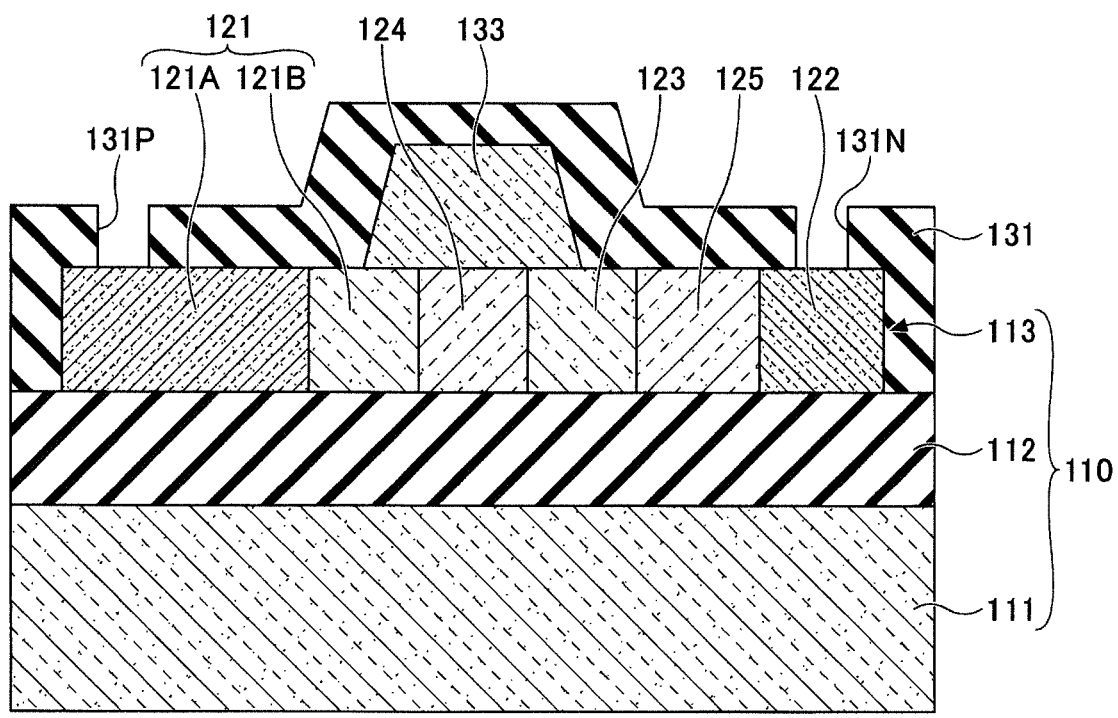
FIG. 13B is a cross-sectional view (10) illustrating a method of fabricating an optical semiconductor device according to the first embodiment.

Subsequently, as illustrated in FIGS. 13A and 13B, an opening 131P reaching the p+ Si region 121A and an opening 131N reaching the n+ Si region 122 are formed in the silicon oxide layer 131. The openings 131P and 131N may be formed, for example, by dry etching. The photoresist mask 157 is then removed.

Figure 14A:
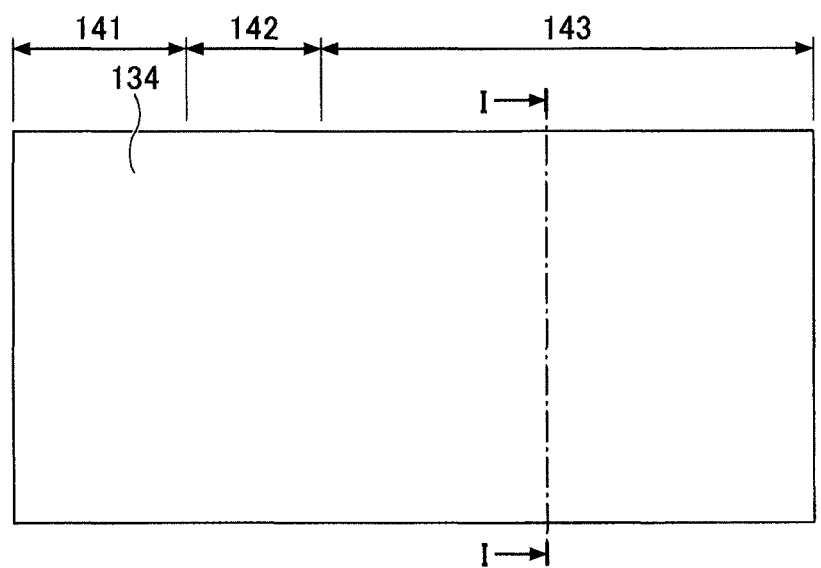
FIG. 14A is a top view (11) illustrating a method of fabricating an optical semiconductor device according to the first embodiment.
Figure 14B:
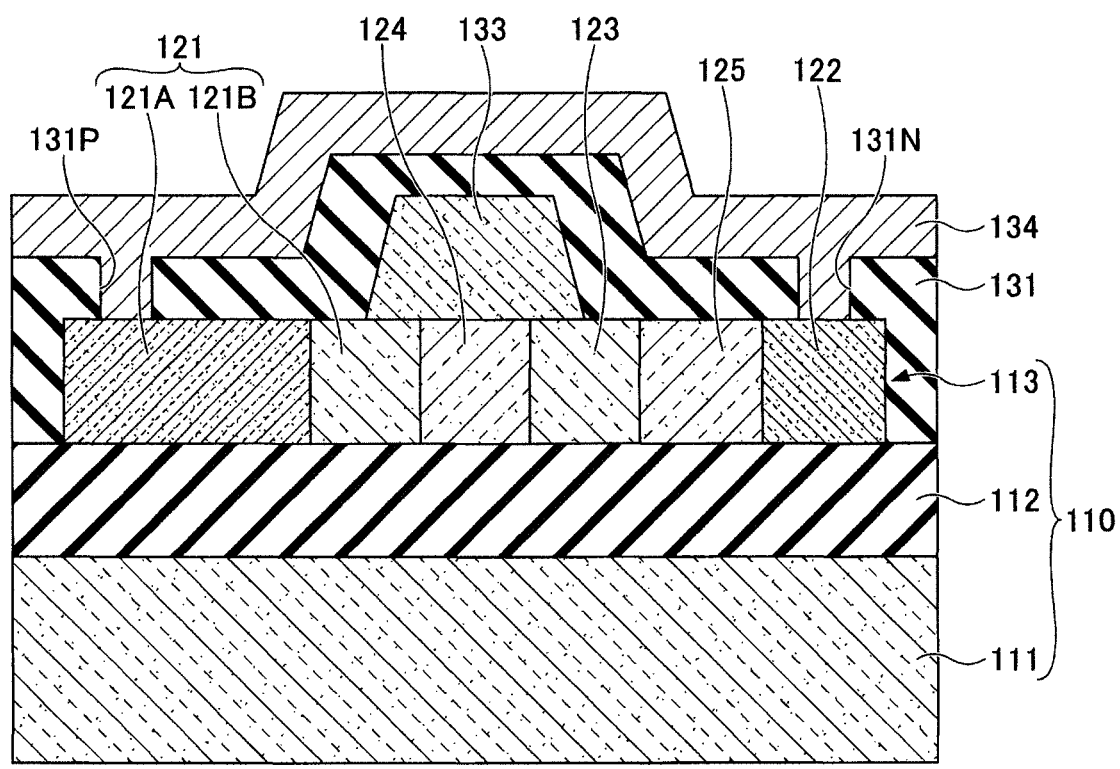
FIG. 14B is a cross-sectional view (11) illustrating a method of fabricating an optical semiconductor device according to the first embodiment.

Thereafter, as illustrated in FIGS. 14A and 14B, the metal film 134 is formed on the silicon oxide layer 131 such that the opening 131P and the opening 131N are filled with. As the metal film 134, for example, an Al film is formed by the sputtering method.

Figure 15A:
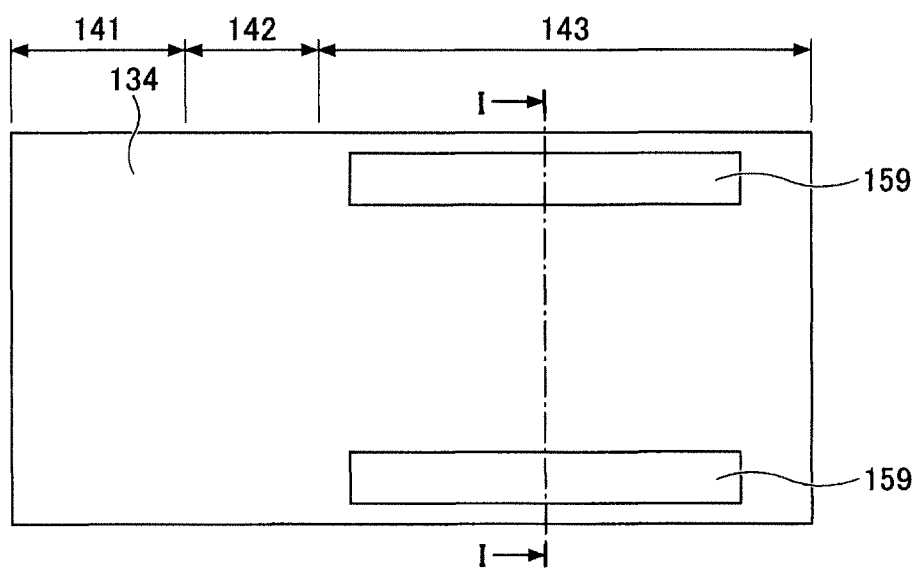
FIG. 15A is a top view (12) illustrating a method of fabricating an optical semiconductor device according to the first embodiment.
Figure 15B:
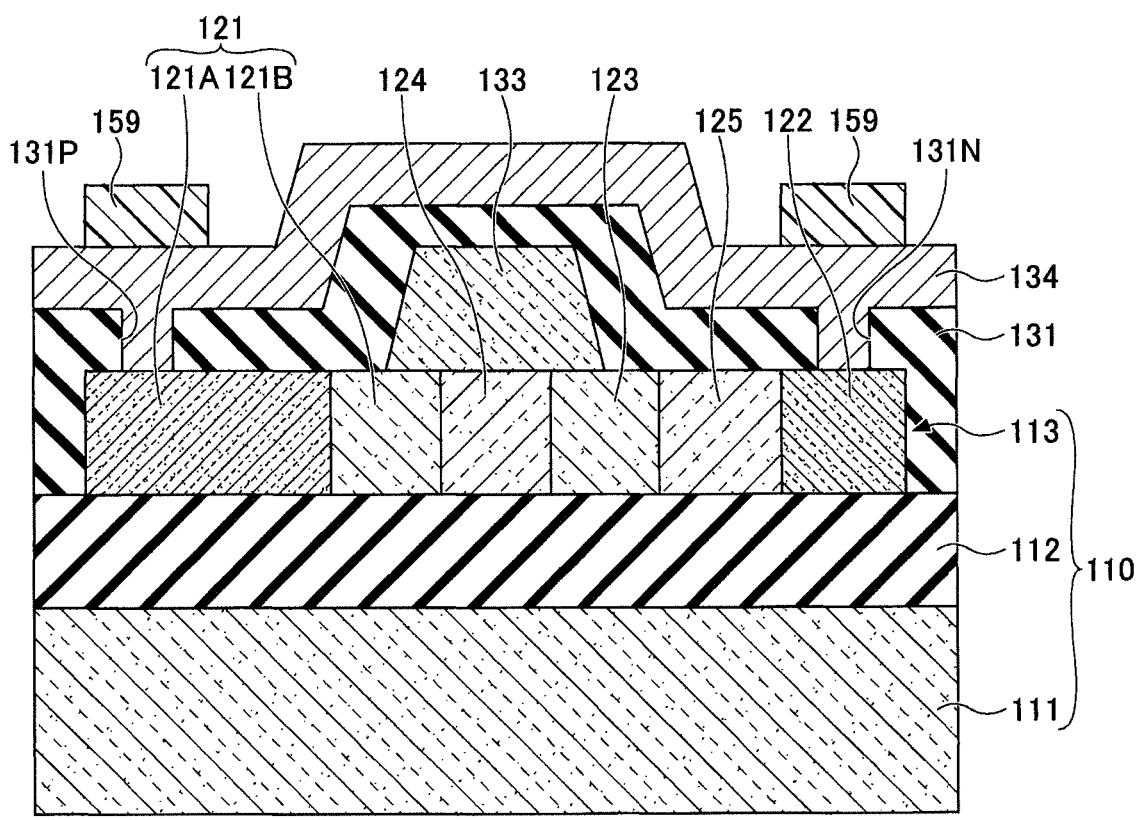
FIG. 15B is a cross-sectional view (12) illustrating a method of fabricating an optical semiconductor device according to the first embodiment.

Subsequently, as illustrated in FIGS. 15A and 15B, a photoresist mask 159 is formed to cover a region for forming the metal film 134P and a region for forming the metal film 134N. The photoresist mask 159 may be formed by the photolithography including application, exposure, and development of a photoresist.

Figure 16A:
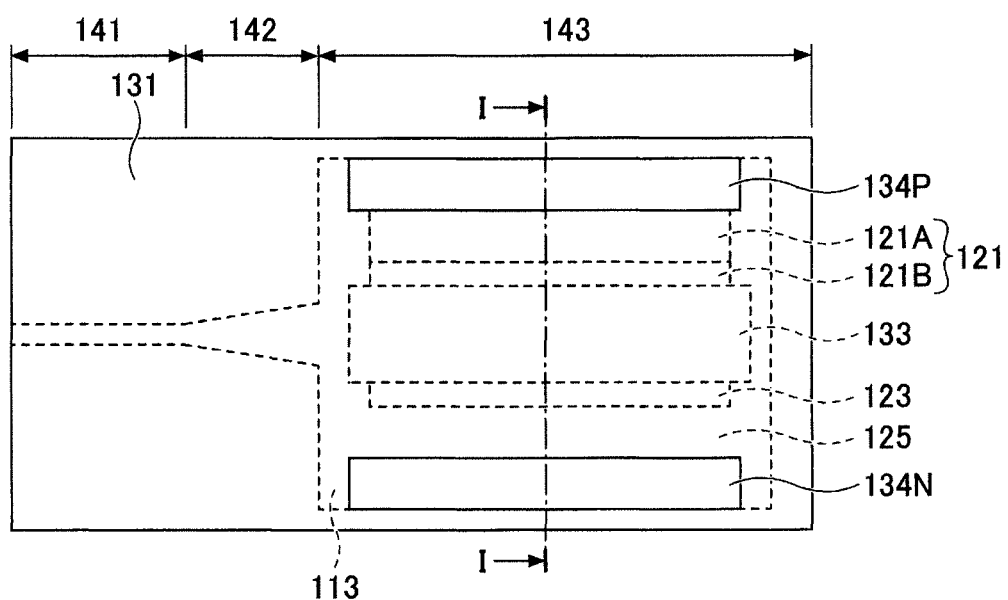
FIG. 16A is a top view (13) illustrating a method of fabricating an optical semiconductor device according to the first embodiment.
Figure 16B:
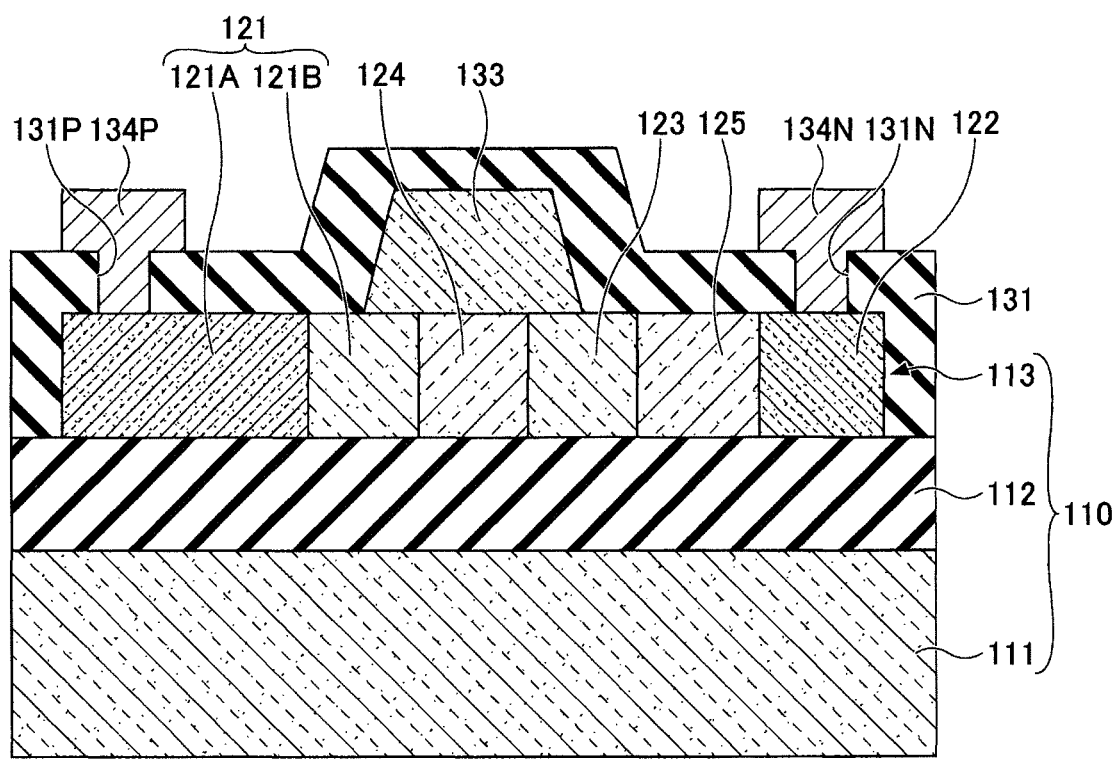
FIG. 16B is a cross-sectional view (13) illustrating a method of fabricating an optical semiconductor device according to the first embodiment.

Subsequently, the metal film 134P and the metal film 134N are formed by dry etching the metal film 134, as illustrated in FIGS. 16A and 16B. The photoresist mask 159 is then removed.

The optical semiconductor device 100 according to the first embodiment may be fabricated in this manner.

In this fabrication method, since a step difference is small, the entire surface may be covered with a low viscosity and thin photoresist, enabling high-precision processing. Exposure of the photoresist may be constantly performed with high precision, because there is no large step difference formed to degrade the focus, upon exposure of the photoresist. In addition, since a subject with which the metal film 134P is in ohmic contact is a Si layer, an appropriate impurity profile may be easily obtained in the thickness direction.

Further, compared to the method of fabricating the optical semiconductor device 900 according to the reference example, a process equivalent to formation of the i-type Si layer 925 or metal contact formation on the Ge layer is not required in the fabrication method of the optical semiconductor device 100 according to the first embodiment; hence, costs of the fabrication process may be significantly reduced.

(Second Embodiment)

Figure 17:
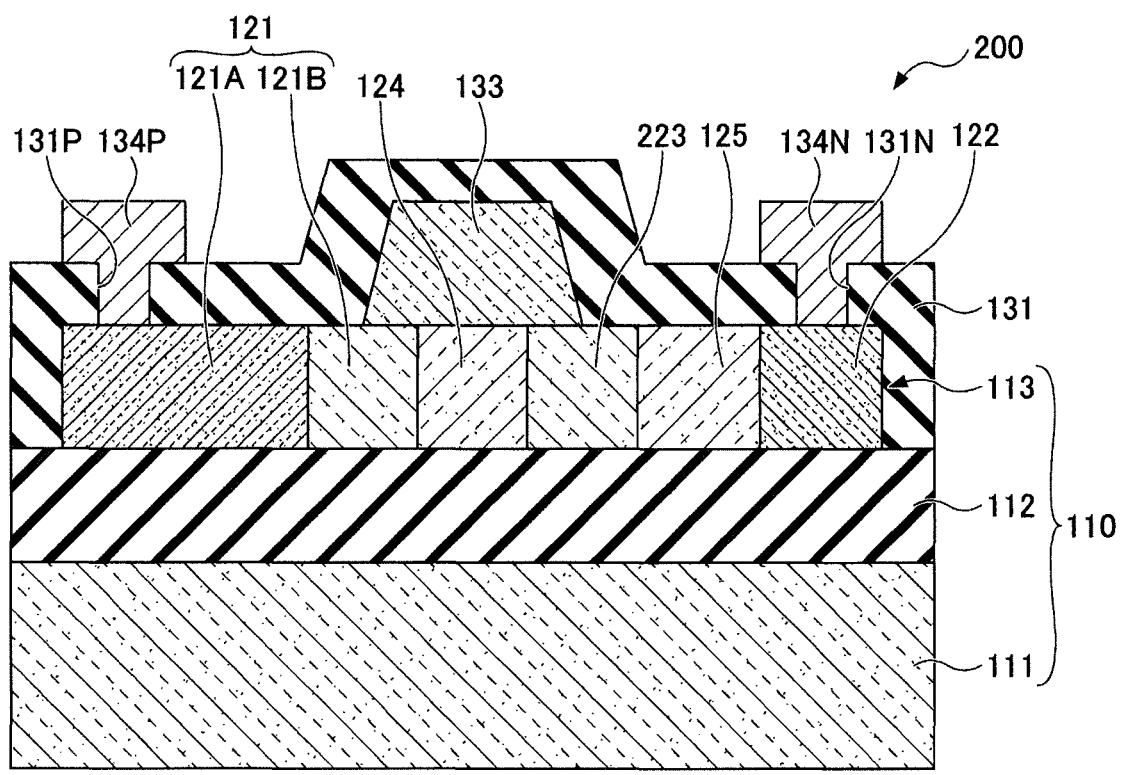
FIG. 17 is a cross-sectional view illustrating a configuration of an optical semiconductor device according to a second embodiment.

The following describes a second embodiment. The second embodiment relates to an optical semiconductor device 200 including an APD. FIG. 17 is a cross-sectional view illustrating a configuration of the optical semiconductor device 200 according to the second embodiment. FIG. 17 corresponds to a cross-sectional view along the I-I line in FIGS. 3A and 3B relating to the first embodiment.

As illustrated in FIG. 17, in the optical semiconductor device 200 according to the second embodiment, an n− Si region 223 is disposed in place of the p− Si region 123 in the optical semiconductor device 100. For example, the n− Si region 223 contains phosphorus (P) at a concentration of $0.5 \times 10^{18}$ cm$^{-3}$ to $1.5 \times 10^{18}$ cm$^{-3}$. The n+ Si region 122 contains n-type dopants at higher concentrations than the n− Si region 223, and the n− Si region 223 is an example of a third region. Other configurations are similar to those of the first embodiment.

The optical semiconductor device 200 formed in this manner includes an APD structure of the p-type region 121 (p+ Si region 121A and p− Si region 121B), the i-type Si region 124, the n− Si region 223, the i-type Si region 125, and the n+ Si region 122, which are electrically disposed in series between the metal film 134P and the metal film 134N. The application of a reverse voltage to the APD structure causes electrons, from among the carriers generated by optical absorption in the i-type Ge layer 133, to be introduced into the i-type Si region 125, and the introduced electrons are accelerated and amplified by the electric field in the i-type Si region 125. That is, the i-type Ge layer 133 serves as a light absorbing layer and the i-type Si region 125 serves as a carrier (electron) multiplication layer.

Then, the same effect as the first embodiment may be obtained. Further, compared to the first embodiment, the second embodiment is preferable in terms of high-speed characteristics because the i-type Ge layer 133 is more easily subjected to a strong electric field. However, in the first embodiment, a strong electric field is easily applied to the i-type Si region 125 that serves as a carrier (electron) multiplication layer, and the first embodiment is thus preferable in terms of the multiplication factor.

The following illustrates a method of fabricating the optical semiconductor device 200 according to the second embodiment. The method of fabricating the optical semiconductor device 200 first performs processes until the formation of the photoresist mask 153 with the opening 154, in the same manner as in the first embodiment (FIGS. 6A and 6B). Subsequently, an n− Si region 223 is then formed in the Si layer 113 by ion implantation of the n-type dopants. Thereafter, processes subsequent to the removal of the photoresist mask 153 are performed in the same manner as the first embodiment. The optical semiconductor device 200 according to the second embodiment may be fabricated in this manner.

(Third Embodiment)

Figure 18:
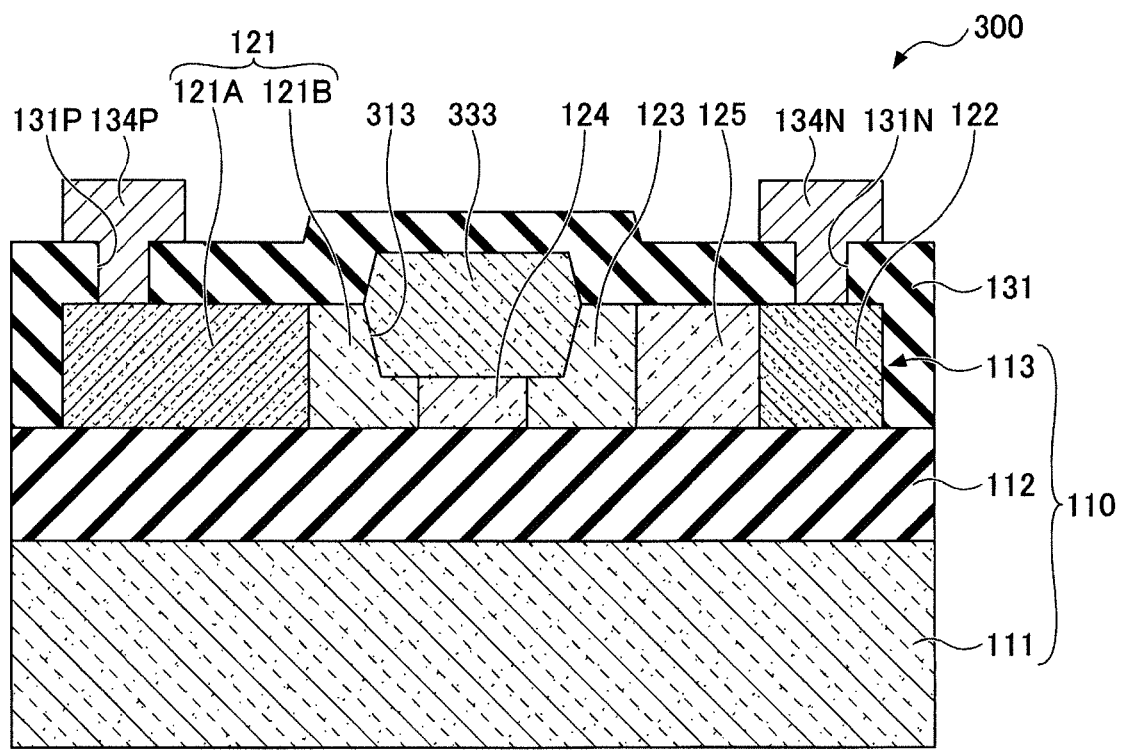
FIG. 18 is a cross-sectional view illustrating a configuration of an optical semiconductor device according to a third embodiment.

The following describes a third embodiment. The third embodiment relates to an optical semiconductor device 300 including an APD. FIG. 18 is a cross-sectional view illustrating a configuration of the optical semiconductor device 300 according to the third embodiment. FIG. 18 corresponds to a cross-sectional view along the I-I line in FIGS. 3A and 3B relating to the first embodiment.

As illustrated in FIG. 18, in the optical semiconductor device 300 according to the third embodiment, a recess 313 is formed in the p− Si region 121B, the i-type Si region 124, and the p− Si region 123 of the Si layer 113, and an i-type Ge layer 333 is formed in place of the i-type Ge layer 133 to fill the recess 313. In other words, the optical semiconductor device 300 employs a butt-joint type structure. For example, the depth of recess 313 is 80 nm to 120 nm. Other configurations are similar to those of the first embodiment.

The optical semiconductor device 300 formed in this manner includes an APD structure of a p-type region 121 (p+ Si region 121A and p− Si region 121B), an i-type Si region 124, a p− Si region 123, an i-type Si region 125, and an n+ Si region 122, which are electrically disposed in series between the metal film 134P and the metal film 134N. The application of a reverse voltage to the APD structure causes electrons, from among the carriers generated by optical absorption in the i-type Ge layer 333, to be introduced into the i-type Si region 125, and the introduced electrons are accelerated and amplified by the electric field in the i-type Si region 125. That is, the i-type Ge layer 333 serves as a light absorbing layer and the i-type Si region 125 serves as a carrier (electron) multiplication layer.

The effect similar to the effect obtained in the first embodiment may be obtained. Further, according to the third embodiment, an electric field may be applied to the i-type Ge layer 333 with higher efficiency. Since the height of an upper surface of the i-type Ge layer 333 relative to an upper surface of the Si layer 113 is lower than the height of an upper surface of the i-type Ge layer 133 in the first embodiment, the accuracy of exposure may be further improved.

Figure 19:
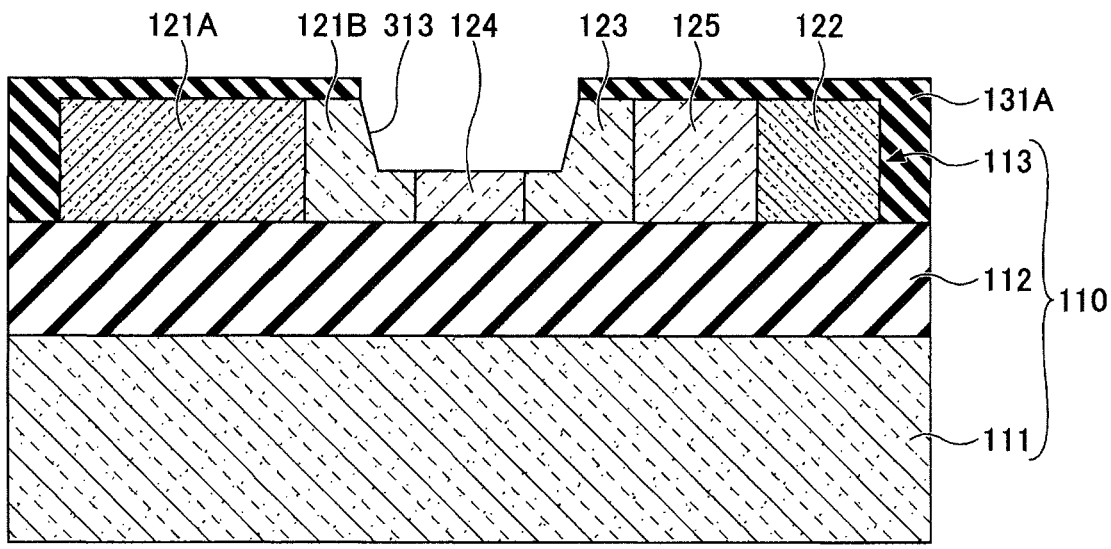
FIG. 19 is a cross-sectional view (1) illustrating a method of fabricating an optical semiconductor device according to the third embodiment.
Figure 20:
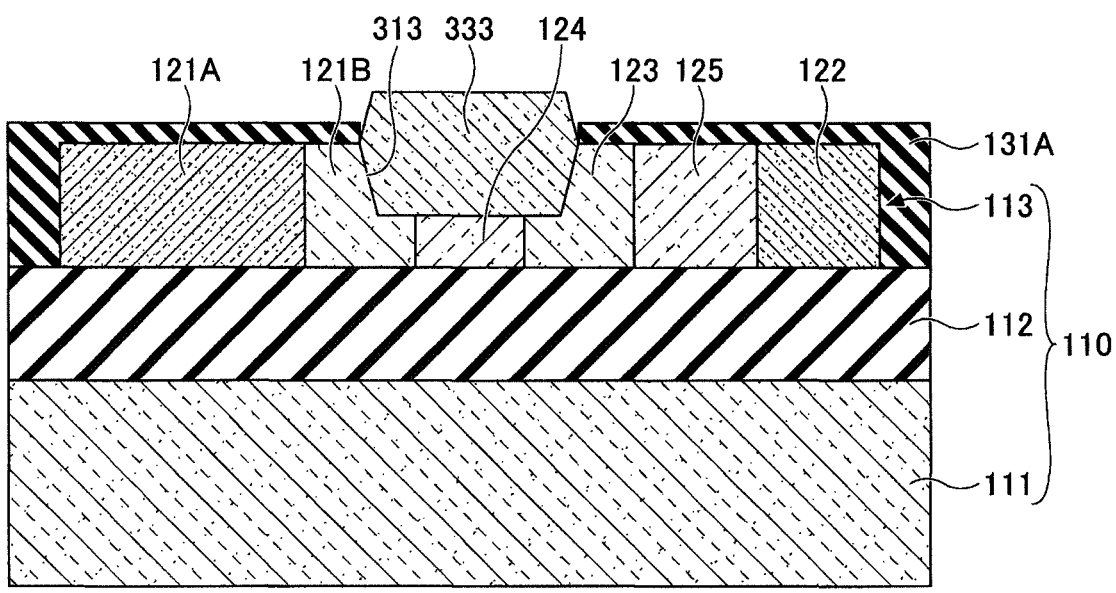
FIG. 20 is a cross-sectional view (2) illustrating a method of fabricating an optical semiconductor device according to the third embodiment.

The following illustrates a method of fabricating the optical semiconductor device 300 according to the third embodiment. FIGS. 19 to 20 are cross-sectional views each illustrating a configuration of the optical semiconductor device 300 according to the third embodiment.

First, the processes until the formation of the opening 132 in the silicon oxide layer 131A are performed in the same manner as in the first embodiment. The photoresist mask 155 is then removed (FIGS. 9A and 9B). Thereafter, the Si layer 113 is etched using the silicon oxide layer 131A as a mask to form a recess 313. The recess 313 may be formed, for example, by ICP dry etching.

Subsequently, as illustrated in FIG. 20, an i-type Ge layer 333 is formed on the Si layer 113 to fill the recess 313. The i-type Ge layer 333 may be formed, for example, by a low pressure (LP) CVD process, with a thickness of 150 nm to 250 nm. For example, the i-type Ge layer 333 is heteroepitaxially grown from the recess 313 in a mesa-like shape.

Thereafter, processes subsequent to the formation of the silicon oxide layer 131 are performed in the same manner as the first embodiment. The optical semiconductor device 300 according to the third embodiment may be fabricated in this manner.

In the fabricating method of the third embodiment, the fabrication process cost is increased by the amount of processing associated with the formation of the recess 313, compared to the first embodiment. However, when an optical component required to form a recess in the Si layer 113, such as a grating coupler used for optical input/output to an optical fiber, is placed outside the optical semiconductor device 300, the process cost will not be increased.

(Fourth Embodiment)

Figure 21:
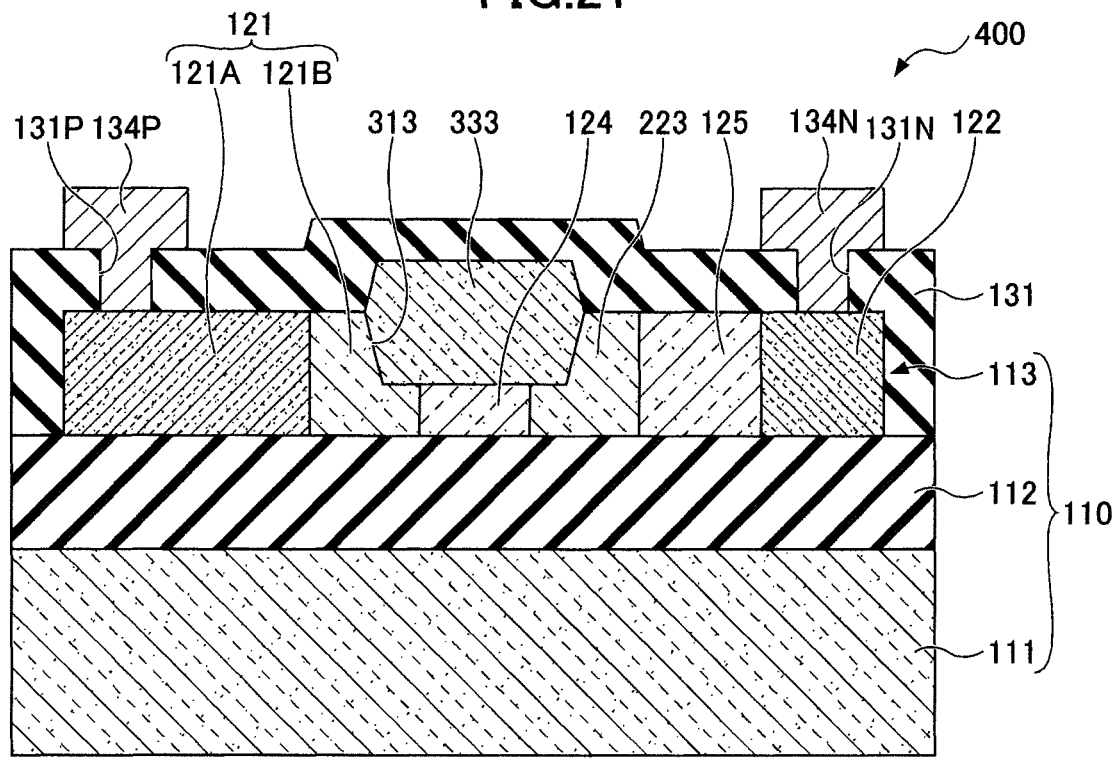
FIG. 21 is a cross-sectional view illustrating a configuration of an optical semiconductor device according to a fourth embodiment.

The following describes a fourth embodiment. The fourth embodiment relates to an optical semiconductor device 400 including an APD. FIG. 21 is a cross-sectional view illustrating a configuration of the optical semiconductor device 400 according to the fourth embodiment. FIG. 21 corresponds to a cross-sectional view along the I-I line in FIGS. 3A and 3B relating to the first embodiment.

As illustrated in FIG. 21, in the optical semiconductor device 400 according to the fourth embodiment, an n⁻ Si region 223 is disposed in place of the p⁻ Si region 123 in the optical semiconductor device 300. For example, the n⁻ Si region 223 contains phosphorus (P) at a concentration of $0.5 \times 10^{18}$ cm$^{-3}$ to $1.5 \times 10^{18}$ cm$^{-3}$. The n⁻ Si region 223 is an example of a third region. Other configurations are similar to those of the third embodiment.

The optical semiconductor device 300 formed in this manner includes an APD structure of the p-type region 121 (p⁺ Si region 121A and p⁻ Si region 121B), the i-type Si region 124, the n⁻ Si region 223, the i-type Si region 125, and the n⁺ Si region 122, which are electrically disposed in series between the metal film 134P and the metal film 134N. The application of a reverse voltage to the APD structure causes electrons, from among the carriers generated by optical absorption in the i-type Ge layer 333, to be introduced into the i-type Si region 125, and the introduced electrons are accelerated and amplified by the electric field in the i-type Si region 125. That is, the i-type Ge layer 333 serves as a light absorbing layer and the i-type Si region 125 serves as a carrier (electron) multiplication layer.

Then, the effect similar to the effect obtained in the third embodiment may be obtained. Further, compared to the third embodiment, the fourth embodiment is preferable in terms of high-speed characteristics because the i-type Ge layer 333 is more easily subjected to a strong electric field. However, in the third embodiment, a strong electric field is easily applied to the i-type Si region 125 that serves as a carrier (electron) multiplication layer, and the third embodiment is thus preferable in terms of the multiplication factor.

The following illustrates a method of fabricating the optical semiconductor device 400 according to the fourth embodiment. The method of fabricating the optical semiconductor device 400 first performs processes until the formation of the photoresist mask 153 with the opening 154 in the same manner as in the third embodiment (FIGS. 6A and 6B). Subsequently, an n⁻ Si region 223 is then formed in the Si layer 113 by ion implantation of the n-type dopants. Thereafter, processes subsequent to the removal of the photoresist mask 153 are performed in the same manner as the third embodiment. The optical semiconductor device 400 according to the fourth embodiment may be fabricated in this manner.

The optical semiconductor devices according to the first to fourth embodiments are capable of implementing high-speed optical communications, and are suitable for integrated circuits in which a semiconductor device for processing electrical signals and an optical semiconductor device are integrated on a Si substrate, for example. For example, the optical semiconductor devices according to the first to fourth embodiments are suitable for high-speed optical communications between a central processing unit (CPU) and memory of a computer, or suitable for high-speed optical communications between CPUs. Specifically, the optical semiconductor devices according to the first to fourth embodiments are prospective next-generation high-capacity optical interconnect applications.

The first and second semiconductor layers are not restricted to Si and Ge. For example, a Si layer may be used as the first semiconductor layer, and a $Si_xGe_{1-x}$ layer ($0 \leq x < 1$) or a $Ge_{1-x}Sn_x$ layer ($0 \leq x < 1$) may be used as the second semiconductor layer.

(Fifth Embodiment)

Figure 22:
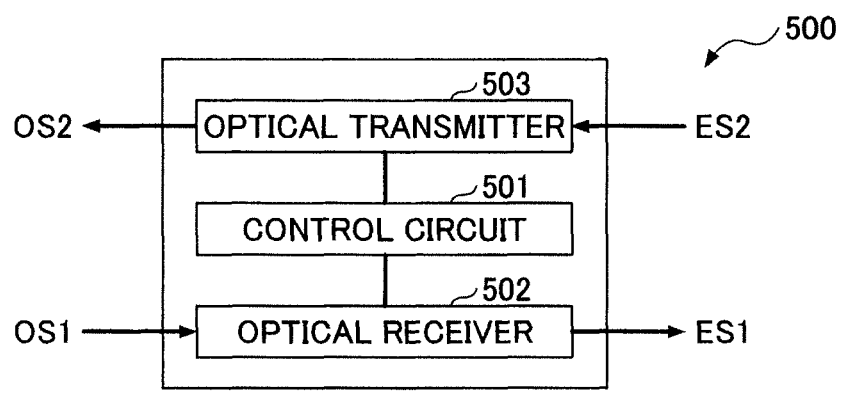
FIG. 22 is a block diagram illustrating a configuration of an optical transceiver according to a fifth embodiment.

The following describes a fifth embodiment. The fifth embodiment relates to an optical transceiver including an optical semiconductor device. FIG. 22 is a block diagram illustrating a configuration of an optical transceiver 500 according to the fifth embodiment.

As illustrated in FIG. 22, the optical transceiver 500 includes a control circuit 501, an optical receiver 502, and an optical transmitter 503. The optical receiver 502 includes an optical semiconductor device according to any of the first to fourth embodiments; the optical receiver 502 is configured to input an optical signal OS1 through an optical waveguide, and to convert the optical signal OS1 into an electrical signal ES1 to output the electrical signal ES1. The optical transmitter 503 is configured to input an electrical signal ES2, and to convert the electrical signal ES2 into an optical signal OS2 to output the optical signal OS2. A control circuit 501 is configured to control the optical receiver 502 and optical transmitter 503. The control circuit 501 may be flip-chip mounted on the optical receiver 502 and/or the optical transmitter 503 via a bump or the like, and may be connected to the optical receiver 502 and the optical transmitter 503 via a bonding wire or the like.

It is desirable to provide optical semiconductor devices and optical transceivers capable of improving opto-electric conversion efficiency.

According to the present disclosure, the opto-electric conversion efficiency may be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. An optical semiconductor device comprising:
   a first semiconductor layer having a first refractive index and a first optical absorption coefficient; and
   a second semiconductor layer formed on the first semiconductor layer, the second semiconductor layer having a second refractive index and a second optical absorption coefficient,
   wherein the second refractive index is larger than the first refractive index, and the second optical absorption coefficient is larger than the first optical absorption coefficient,
   wherein the first semiconductor layer includes:
      a first region of p-type;
      a second region of n-type;
      a third region of p-type or n-type between the first region and the second region;
      a fourth region of i-type between the first region and the third region; and
      a fifth region of i-type between the second region and the third region; and
   wherein the second semiconductor layer is formed on the first region, the fourth region, and the third region,
   wherein the optical semiconductor device further includes:
      a first metal film in ohmic contact with the first region; and
      a second metal film in ohmic contact with the second region,
   wherein the first region includes:
      a sixth region in contact with the first metal film; and
      a seventh region in contact with the fourth region, and
   wherein the sixth region includes a p-type dopant at a higher concentration than the seventh region.

2. The optical semiconductor device as claimed in claim 1, wherein
   the third region is n-type, and
   the second region includes an n-type dopant at a higher concentration than the third region.

3. The optical semiconductor device as claimed in claim 1, wherein
   a recess is formed in a region where the first semiconductor layer is in contact with the second semiconductor layer.

4. The optical semiconductor device as claimed in claim 1, further comprising:
   an opto-electric converter including the first semiconductor layer and the second semiconductor layer that overlap each other in a plan view,
   a mode converter connected to the opto-electric converter, wherein
   in the mode converter, the first semiconductor layer has a planar shape having a width that increases toward the opto-electric converter.

5. The optical semiconductor device as claimed in claim 1, wherein
   the first semiconductor layer is a Si layer, and
   the second semiconductor layer is a $Si_xGe_{1-x}$ layer ($0 \leq x < 1$).

6. The optical semiconductor device as claimed in claim 1, wherein
   the first semiconductor layer is a Si layer, and
   the second semiconductor layer is a $Ge_{1-x}Sn_x$ layer ($0 \leq x < 1$).

7. An optical transceiver comprising:
   the optical semiconductor device as claimed in claim 1.

* * * * *